(12) United States Patent
Pupalaikis et al.

(10) Patent No.: US 7,222,055 B2
(45) Date of Patent: *May 22, 2007

(54) HIGH BANDWIDTH REAL-TIME OSCILLOSCOPE

(75) Inventors: Peter J. Pupalaikis, Ramsey, NJ (US); David C. Graef, Campbell Hall, NY (US)

(73) Assignee: LeCroy Corporation, Chestnut Ridge, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 11/270,187
(22) Filed: Nov. 9, 2005

(65) Prior Publication Data

US 2006/0074606 A1 Apr. 6, 2006

Related U.S. Application Data

(63) Continuation of application No. 10/693,188, filed on Oct. 24, 2003, now Pat. No. 7,058,548.

(60) Provisional application No. 60/420,937, filed on Oct. 24, 2002.

(51) Int. Cl.
*G01R 23/00* (2006.01)
(52) U.S. Cl. ............... 702/189; 702/75; 702/76; 341/155; 341/126
(58) Field of Classification Search ............. 702/66, 702/67, 189, 69–71, 73–76, 106, 112, 124, 702/126, 110, 140, 191, 195, 197, 198
See application file for complete search history.

(56) References Cited

U.S. PATENT DOCUMENTS

| 3,783,413 A | 1/1974 | Froment et al. ............ 708/819 |
| 3,891,803 A | 6/1975 | Daguet et al. ............. 370/210 |
| 3,903,484 A | 9/1975 | Testani .................... 331/135 |

(Continued)

FOREIGN PATENT DOCUMENTS

EP    0 275 136    7/1988

(Continued)

OTHER PUBLICATIONS

Real-Time Spectrum Analysis Tools Aid Transition to Third-Generation Wireless Technology: Tektronix, Inc. 1999, pp. 1-6.

(Continued)

*Primary Examiner*—Hal Wachsman
(74) *Attorney, Agent, or Firm*—Frommer Lawrence & Haug LLP; William S. Frommer

(57) ABSTRACT

A method and apparatus for digitizing a signal. The method comprises the steps of receiving an input analog signal, splitting the received input analog signal into a plurality of signals and frequency converting at least one of the signals in accordance with a predetermined periodic function having a predetermined frequency. The signals are then digitized and combined mathematically to form a single output stream that is a substantially correct representation of the original input analog signal.

58 Claims, 23 Drawing Sheets

U.S. PATENT DOCUMENTS

| | | | | |
|---|---|---|---|---|
| 4,316,282 | A | | 2/1982 | Macina ........................ 370/484 |
| 4,354,277 | A | * | 10/1982 | Crackel et al. ............. 455/259 |
| 5,187,803 | A | * | 2/1993 | Sohner et al. ............. 455/3.03 |
| 5,659,546 | A | | 8/1997 | Elder ........................ 370/343 |
| 5,668,836 | A | | 9/1997 | Smith et al. ................ 375/316 |
| 5,950,119 | A | | 9/1999 | McGeehan et al. .......... 455/302 |
| 6,240,150 | B1 | | 5/2001 | Darveau et al. ............ 375/350 |
| 6,340,883 | B1 | | 1/2002 | Nara et al. ............... 324/76.78 |
| 6,380,879 | B2 | | 4/2002 | Kober et al. ................ 371/155 |
| 2002/0150173 | A1 | | 10/2002 | Buda ......................... 375/316 |
| 2002/0181614 | A1 | * | 12/2002 | Mostafa et al. ............. 375/316 |
| 2004/0041599 | A1 | | 3/2004 | Murphy ...................... 327/129 |
| 2004/0246047 | A1 | * | 12/2004 | Manku et al. .............. 329/315 |

FOREIGN PATENT DOCUMENTS

EP        0 589 594       3/1994

OTHER PUBLICATIONS

A Matter of Time: Today's RF Signals Call for a Different Kind of Spectrum Analysis; Tektronix, Inc. 2000, pp. 1-8, no month.

Signature™—High Performance Signal Analyzer 100 Hz to 8 GHz: Anritsu, 2000., pp. 1-2, no month.

Agilent E5052A Signal Source Analyzer 10 MHz to 7 GHz; Agilent Technologies, Jun. 9, 2004, pp. 1-3.

R3681 Signal Analyzer; Advantest, 2004, pp. 1-2, no month.

RF Front-end Considerations for SDR Ultra-Wideband Communications Systems; Stephanie Paquelet et al.; RF Design, Jul. 2004, pp. 44-51.

On Perfect Reconstruction in Critically Sampled Frequency-Domain Scrambler; J.A. Apolinario, Jr., et al.; pp. 1-4, no month.

Sampling and Reconstruction of Periodic Signals; Teodor Neagoe et al.; Apr. 2004, pp. 1-15.

Putting Undersampling to Work; Pentek, Inc.; pp. 1-2, no date.

Reconstruction of Nonuniformly Sampled Bandlimited Signals by Means of Digital Fractional Delay Filters; Hakan Johansson et al.; IEEE Transactions on Signal Processing, vol. 50, No. 11, Nov. 2002; pp. 2757-2767.

Japanese Abstract of JP 06 197019—Hitachi Denshi Ltd.; Jul. 15, 1994.

High-Performance Advanced Filter Bank Analog-to-Digital Converter for Universal RF Receivers; Scott R. Velazquez, V Company; IEEE 1998; pp. 229-232, no month.

Frequency Domain Approach for CMOS Ultra-Wideband Radios; Hyung-Jin Lee et al.; Proceedings for the IEEE Computer Society Annual Symposium on VLSI, 2003; pp. 1-2, no month.

Frequency-Interleaving Technique for High-Speed A/D Conversion; G. Ding et al.; IEEE 2003; pp. 1-857-1-860, no month.

Design of Hybrid Filter Banks for Analog/Digital Conversion; Scott R. Velazquez et al.; IEEE Transactions on Signal Processing, vol. 46, No. 4, Apr. 1998; pp. 956-967.

Analog to Digital Conversion of Ultra-Wideband Signals in Orthogonal Spaces; Sebastian Hoyos et al.; IEEE 2003; pp. 47-51, no month.

Understanding Digital Signal Processing; Richard G. Lyons; Prentice Hall Professional Technical Reference, Second Edition 2004; pp. 30-39; 346-360; 471-479; and 571-572, no month.

Electronics Engineers' Handbook; Donald G. Fink et al.; McGraw Hill Book Company, First Edition 1975; pp. 4-32;14-28 to 14-29; 14-65 to 14-69 and 22-30 to 22-31, no month.

Real-Time Speech Frequency Scrambling and Descrambling (Undated), 17 pages.

Optional Block Function Library for Hypersignal® Block Diagram/RIDE; Advanced Transmission Library; Hyperception, Inc. 1997, no month.

* cited by examiner

— Actual Input Step
••• Sum of Three Components

HIGH BANDWIDTH REAL-TIME OSCILLOSCOPE

CROSS-REFERENCE TO RELATED APPLICATIONS

This application is a continuation of U.S. patent application Ser. No. 10/693,188 filed Oct. 24, 2003 now U.S. Pat. No. 7,058,548, currently pending, which in turn claims the benefit of U.S. Provisional Patent Application 60/420,937 filed Oct. 24, 2002. The entire contents of each of these prior applications are incorporated herein by reference.

FIELD OF THE INVENTION

The present invention relates to a high bandwidth real-time digital storage oscilloscope (DSO) incorporating heterodyning to increase the bandwidth of a typical oscilloscope design.

BACKGROUND OF THE INVENTION

A digital storage oscilloscope (DSO) is the primary tool utilized by engineers to view electrical signals. As signals get ever faster, it is very beneficial to have DSOs capable of digitizing, displaying and analyzing these faster signals. The capability of a DSO to digitize fast signals is determined by its bandwidth and sample rate.

Because one of the uses of the DSO is to design and analyze new electronic devices, DSOs employed in the design of high speed electronics must operate at a bandwidth sufficient to capture and display signals from these devices. Providing ever-faster sampling circuitry is one way to increase bandwidth, but is subject to practical limitations in hardware development. There are a number of other methods that have been traditionally employed in an attempt to provide additional bandwidth. One of the more common methods is called equivalent time sampling and is based upon triggering repeatedly on a periodic event. Data from multiple trigger events can be combined to provide a more complete and accurate view of the waveform. This technique is employed in a conventional sampling oscilloscope. A sampling oscilloscope repeatedly triggers on an event and acquires only a few points of the periodically repeating waveform (sometimes only one point of the waveform) in response to each trigger event. After repeated triggers, the acquired data points are combined to display a high effective sampling rate representation of the waveform. However, such a sampling oscilloscope requires a repetitive input signal so that the representation of the waveform can be generated over many triggers. This method also makes certain desirable types of analyses of the waveform, such as cycle-to-cycle jitter, impossible.

A common problem in complex signal analysis is that a non-repetitive signal must be analyzed. In fact, it is very often the case that a non-repetitive event is the cause of some failure in an electronic system. It is the function of the test equipment to help the user identify the cause of the failure. Therefore, a piece of test equipment that requires repetitive signals may be of limited usefulness. Situations when the user wants to capture or look at infrequent or non-repetitive events require a DSO capable of operating with high bandwidth and sample rate in response to a single trigger. Such a DSO that allows for acquisition of a signal based upon only a single trigger event is called a real-time oscilloscope. Acquisitions taken utilizing only a single trigger event are called single-shot acquisitions.

While architectural techniques, such as channel combination, interleaving, and the like are generally available for designing high sample rate real time oscilloscopes, designing real time oscilloscopes that simultaneously achieve high bandwidth and high sample rate is another issue. Increasing bandwidth in such a real time oscilloscope is typically dealt with through direct application of ever faster, very good high-speed electronics. Increasing the sample rate is generally achieved by the application of various interleaving techniques. As noted above, a real-time DSO is more useful in certain situations than a sampling oscilloscope, even though a sampling oscilloscope provides high bandwidth and effective sampling rate. This is because unlike a sampling oscilloscope, a real time DSO does not require the input signal to be repetitive. However, in order to allow for acquisition of enough sampling points in real time to accurately reproduce the acquired signal, the bandwidth of the real-time scope may be limited.

Even with current design techniques it is difficult to achieve simultaneously very high bandwidths and sampling rates.

SUMMARY OF THE INVENTION

This invention pertains generally to systems that digitize waveforms; and more specifically systems that convert an analog input signal to a digital output signal whereby the digital signal consists of an array of numbers that represent the amplitude of the analog waveform at known times. This invention also pertains to systems with limited bandwidth where there is a need for higher bandwidth. This invention therefore addresses systems incapable of accurately digitizing very rapidly changing signals.

The most specific application of this invention is to real-time Digital Storage Oscilloscopes (DSOs) where high demands are placed on the bandwidth of signals digitized in a single-shot acquisition.

The invention accordingly comprises, in a preferred embodiment, a method and apparatus for digitizing a signal. The method comprises the steps of receiving an input analog signal and splitting the received input analog signal into a plurality of band limited signals. The frequency of at least one of the band limited signals is frequency converted in accordance with a predetermined periodic function having a predetermined frequency. After frequency conversion, the band limited signals are digitized and subsequently combined mathematically to form a single output digital datastream that is a substantially correct representation of the original input signal.

It is therefore an object of the invention to overcome the drawbacks of the prior art.

Still other objects and advantages of the invention will in part be obvious and will in part be apparent from the specification and the drawings.

The invention accordingly comprises the several steps and the relation of one or more of such steps with respect to each of the others, and the apparatus embodying features of construction, combinations of elements and arrangement of parts that are adapted to effect such steps, all as exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which.

DETAILED DESCRIPTION OF THE PREFERRED EMBODIMENTS

Figure 1:
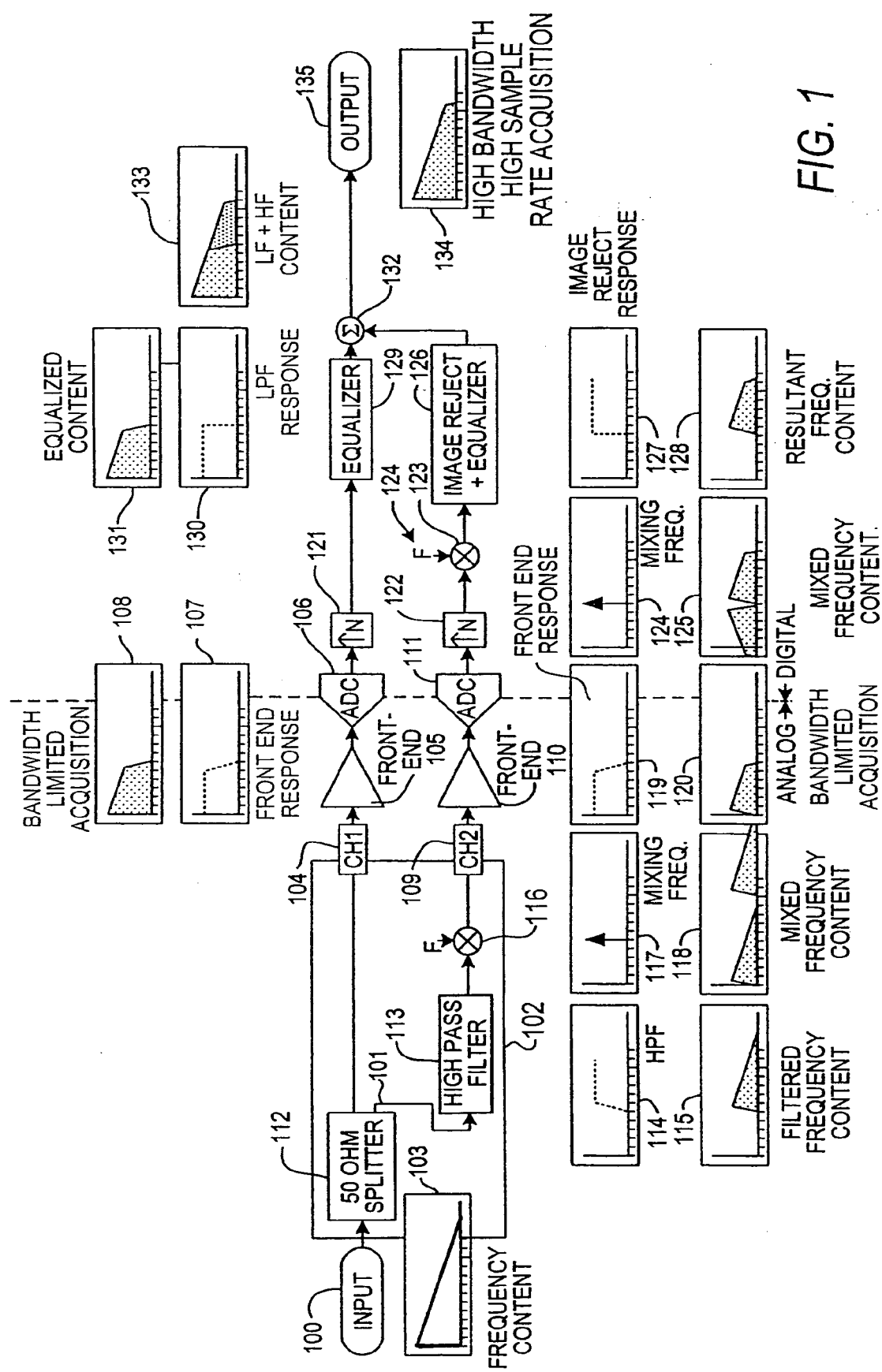
FIG. 1 is a block diagram depicting a digitizing system constructed in accordance with the invention.

FIG. 1 is a block diagram showing a high bandwidth digital storage oscilloscope (DSO) architecture according to a first embodiment of the present invention. FIG. 1 shows two channels of a DSO combined to digitize waveforms in a manner that effectively doubles the system bandwidth. It should be understood that the bandwidth can be tripled, quadrupled etc. by utilizing three, four or more channels in combination. There is no inherent limitation on the number of channels that may be utilized.

As is shown in FIG. 1 an input signal 100 is provided at the input. Viewed from the frequency-domain perspective, the input signal might have a frequency content shown at 103. In a standard configuration input signal 100 directly enters a first channel, CH1 at 104. This signal passes through an analog front end 105, and on to an ADC 106 which digitizes the waveform. The channel has a finite bandwidth, as shown by 108 which results in a digitized waveform of finite bandwidth 107. For the purpose of future explanation, the cutoff frequency at which the bandwidth is limited is designated as F.

The first embodiment of the present invention involves the addition of analog circuitry 112 and 102 between the input 100 and the two channels 104 and 109 and downstream processing of the digital data to work with this additional hardware. In accordance with the present invention, the signal at input 100 with example frequency content 103 enters a power splitter 112, or power amplifier, diplexer, or the like, as appropriate. The splitter 112 provides a termination to the input signal and provides at its two equally attenuated outputs the same signal attenuated by a known amount. One output of splitter 112 directly connects to CH1 channel (104). The signal proceeds through front-end 105 and is digitized in a conventional manner by ADC 106 as described above. Because the combination of front-end 105 and ADC 106 is bandwidth limited, as shown in 108, this results in a bandwidth limited acquisition with frequency content shown by 107. CH1 channel (104) is designated as containing the low frequency (LF) portion of the signal. Note, however, that the high and low frequency signals could be switched, therefore processing the low frequency signal and passing the high frequency signal through without the processing to be described below. The path through the other output of splitter 112 will be described below and is designated as the high frequency (HF) path.

The invention only adds the power splitter or diplexer directly in the signal path of CH1 channel (104). In other words, the low frequency signal path with the splitter removed looks identical to the signal path of the DSO not utilizing this invention. Very high quality splitters and diplexers with very high bandwidth are readily commercially available and as such, do not serve to degrade the signal path.

The HF signal path will now be explained in greater detail. It is well known that frequencies can be translated through the use of a process called heterodyning. Heterodyning is achieved through the time-domain multiplication of a signal with a sinusoidal signal, resulting in a frequency converted signal. It is well known that if a sinusoid with a frequency $f_0$ is mixed with another sinusoid with a frequency $f_1$, the result is two sinusoids at sum and difference frequencies (i.e. sinusoids at frequencies $f_0+f_1$ and $f_0-f_1$ which will be referred to as images) with each sinusoid being half the amplitude of the product of the amplitudes of $f_0$ and $f_1$:

$$[A_0 \cdot \cos(2 \cdot \pi \cdot f_0)] \cdot [A_1 \cdot \cos(2 \cdot \pi \cdot f_1)] \rightarrow$$
$$\frac{A_0 \cdot A_1}{2} \cdot [\cos(2 \cdot \pi \cdot (f_0 + f_1)) + \cos(2 \cdot \pi \cdot (f_0 - f_1))]$$

In FIG. 1, the signal from the second output of splitter 112 (signal 101) enters a high pass filter 113. High-pass filter 113 is designed to reject to the greatest extent possible all frequencies below frequency F as shown in 114. The result of high pass filtering the input signal with frequency content as shown in 103 is shown in 115. The output of 113 is heterodyned with a sinusoid at frequency F utilizing mixer 116. The result of mixing the signal with frequency content shown by 115 with the sinusoidal signal having a frequency F shown in 117 is the frequency content shown in 118. 118 shows that two images of the content shown in 115 are produced at the sum and difference frequencies, as noted above. In cases where the cutoff of the high-pass filter is inadequate, thereby allowing overlap between the defined low and high frequency bands, the heterodyning frequency may be chosen slightly higher such that a dead-band is utilized to prevent the low frequency edges of the high-pass filter output from folding back into the pass-band.

The output of mixer 116 connects to CH2 channel (109)—the high frequency channel. The signal passes through a front-end 110 and is digitized by an ADC 111. Since like CH1 channel (104), the combination of front-end 110 and ADC 111 is bandwidth limited, as shown in 119 this results in a bandwidth limited acquisition with frequency content shown by 120. The digitizing through ADCs 106 and 111 occur substantially simultaneously in parallel, so channels CH1 and CH2 are substantially simultaneously acquired. If the digitizing does not take place in such a substantially simultaneous manner, the resulting digital data may be stored and processed to compensate for any transmission time differences between the two channels.

To summarize, the signals seen at the inputs to each of the channels are as follows. The LF CH1 channel (104) sees the input waveform directly. The HF CH2 channel (109) sees only the frequency content in the frequency band extending upward from F. Through the use of heterodyning, the HF CH2 channel sees the frequency content of an input signal at frequency F+ΔF at frequency ΔF. Thus, the input signal has been frequency converted to a lower frequency band. Although there were two images (seen in 118), the second image is rejected due to the finite channel bandwidth 119. It should also be noted that part of the first image may also be at least partially rejected depending on the choice of frequencies. Said differently, the LF CH1 channel acquires the low frequency content of the input signal from 0 to F, while the HF CH2 channel acquires the frequency content of the input signal from F to 2·F. This HF CH2 signal is frequency converted to a lower frequency band, namely from frequency band F to 2·F to the frequency band of 0 to F so it fits into the bandwidth of the front end. Thus, the band from DC to 2F (2F frequency content) input signal has been made to fit into two channels each of bandwidth F.

Both the LF and HF signals are then digitized. It is assumed that both channels are sampling at a rate consistent with the requirements of a channel having a bandwidth F. Such a sufficiently sampled channel (satisfying the Nyquist Criterion) allows for the complete reconstruction of the signal. Each channel may be upsampled utilizing upsamplers 121 and 122 so that during processing, undesirable portions of the image may be sufficiently separated from the desired image, and therefore rejected. This upsampling is performed utilizing a method such as SinX/X interpolation (or any other well known method for this process) to interpolate between acquired sample points. The method and validity of this and other methods of interpolation are well known to those skilled in the art.

The data from the HF (CH2) channel is then digitally heterodyned at a digital heterodyning mixer 123, preferably numerically by combination with a digitally synthesized periodic signal, such as a sinusoid for example, having substantially the same frequency F (124) as, and having a substantially fixed phase relationship with, a local oscillator of analog mixer 116 in the analog HF signal path. The result of digital heterodyning mixer 123 is two images of the HF signal shown by 125. Each image appears respectively at frequencies from 0 to F and from F to 2·F. The first, low frequency image is mirrored about F and is not used. The second image is a replica of the actual high frequency content of the input signal. The output of digital mixer 123 passes through an image reject filter plus equalization 126, which has a frequency response shown by 127, for rejection of the lower frequency image. The result is the frequency content shown in 128.

The result at this point is two digital waveforms, one representing the low frequency portion of the input signal 107 and the other representing the high frequency portion of the input signal 128.

Because both signals passed through imperfect channels, they may be equalized separately to compensate for non-ideal magnitude and phase characteristics, including transmission delay of the front-end and digitizing systems. The equalizer for the CH1 channel (129) is shown in this example with its response 130 being an ideal low-pass filter. This results in no change between the frequency content shown in 108 and the equalized content shown in 131 with the understanding that this would not necessarily be the case if there were imperfections in the signal 131. The equalizer for the CH2 channel is shown integrated with the image reject filter 126. Both equalizers also have the difficult job of preparing the signals to accommodate the cross-over from LF to HF.

Finally, the waveform resulting from the LF channel equalizer 129 is combined with the waveform resulting from the HF channel equalizer 126 by a combiner 132. The result of this combination is shown by the combination of the LF frequency content in 131 and the HF content in 128, shown graphically in 133. Thus, the output 135 is a high-bandwidth, high-sample rate acquisition with the frequency content as shown in 134. A detailed numerical example stepping through this process is provided below.

To summarize the effect, the input signal with frequency content 103 normally would be digitized by one channel to form an acquisition with frequency content shown in 108. Instead, as a result of this embodiment of the invention, two channels are utilized and the resulting acquisition has twice the bandwidth as demonstrated by the signal frequency content shown in 134. Note that the two other benefits of traditional time interleaving—that of doubling the sample rate and allocation of two channels of memory to one signal—are still achieved by this invention.

Figure 2:
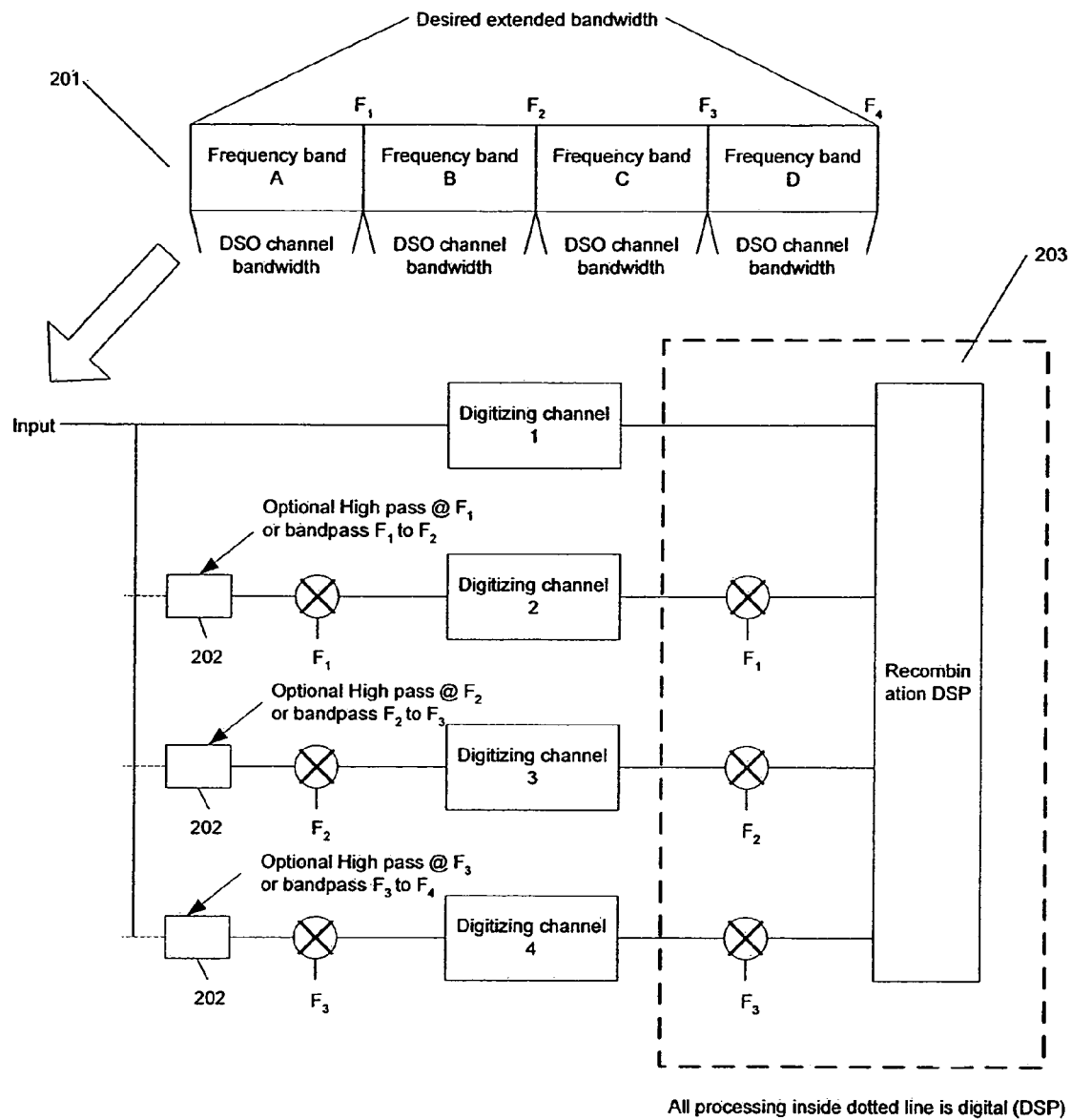
FIG. 2 is a block diagram showing one possible method of the extension of this technique to 4 channels using a mixing frequency that is at the low side of the frequency band of interest (low side conversion)

Multiple channels could be combined in similar arrangements whereby the system bandwidth is increased by a factor equal to the number of combined channels. An example showing how this technique may be used to extend the bandwidth four times using four channels is shown in FIG. 2. FIG. 2 depicts a low side conversion. In this case, frequency bands B, C and D in 201 are frequency translated down by heterodyning, and then is digitized by channels 2, 3 and 4 respectively. Frequency band A in 201 is digitized directly by channel 1. The filter blocks shown (202) are optional. The goal is to sufficiently isolate each desired frequency band. This can be done, in this example, using a highpass filter, a bandpass filter or no filter at all. In the case of no filter, there will be images of the adjacent frequency band that will be digitized by the channel. As long as they do not overlap, these can be removed using DSP techniques in the recombination DSP block (203), as will be described below. This recombination technique is shown in a first example for a low side conversion (using three channels) in FIGS. 4–26.

Figure 3:
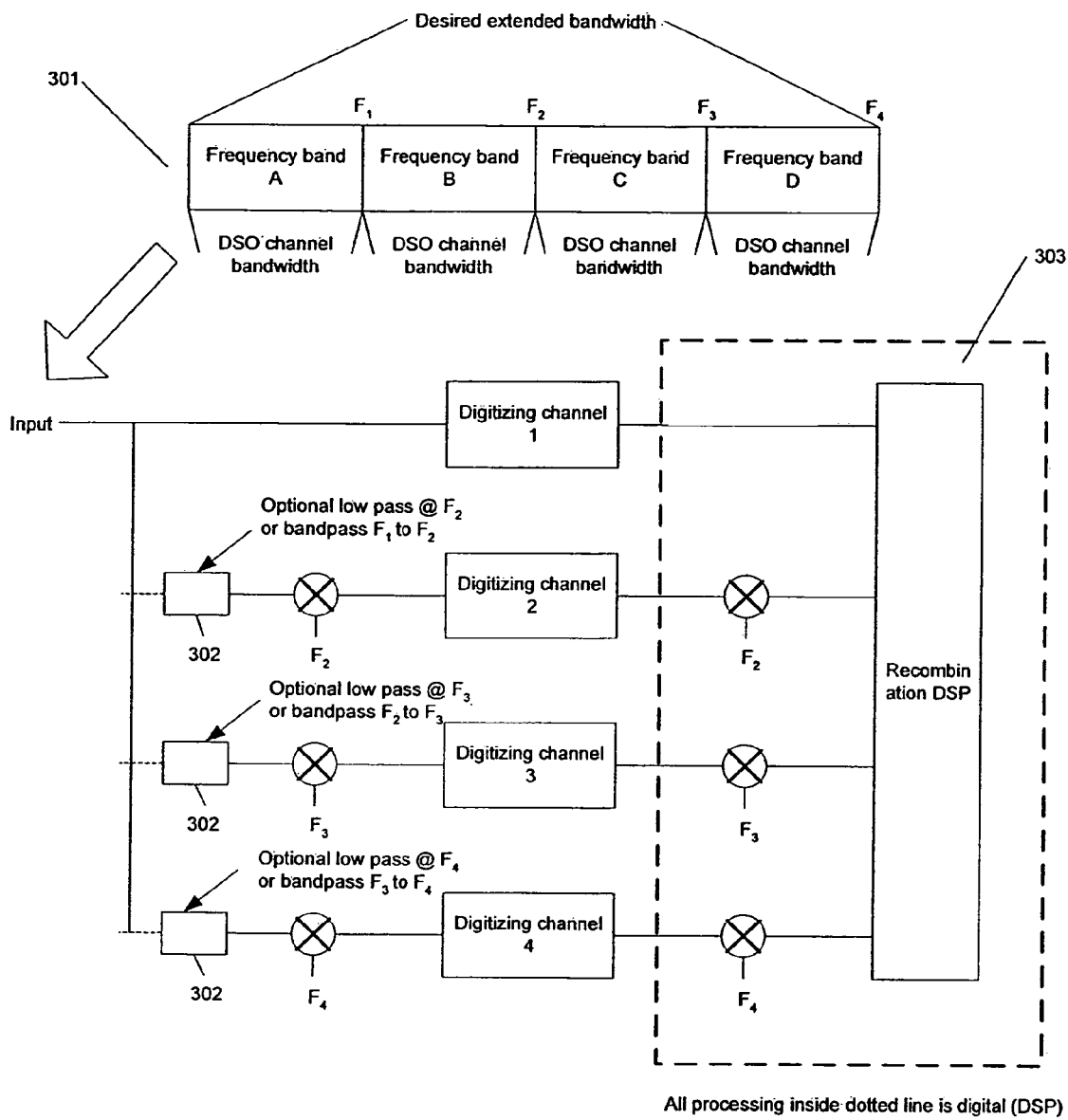
FIG. 3 is a block diagram showing another possible method of the extension of this technique to 4 channels using a mixing frequency that is at the high side of the frequency band of interest (high side conversion)

Another example of how this technique can be applied is shown in FIG. 3. FIG. 3 depicts a high side conversion. Careful inspection of FIG. 3 will show that the major difference between FIG. 2 and FIG. 3 is the frequency used in heterodyning the frequency band of interest into the low frequency band of the corresponding acquisition channel. FIG. 2 uses a frequency on the low side of the band of interest ($F_1$) to heterodyne frequency band "B" to the frequency band of the acquisition system whereas FIG. 3 uses a frequency on the high side of the band of interest ($F_2$) to heterodyne frequency band "B" to the frequency band of the acquisition system. Note that the translated frequency band is "reversed" if high side conversion is used. That is, the highest frequency in frequency band "B" ($F_2$) becomes the lowest frequency in the translated band. This will be corrected in the reconstruction by using $F_2$ as the up-conversion frequency in the DSP reconstruction of the signal. This recombination technique is shown in a second example for a high side conversion (using two channels) in FIGS. 27–57.

When recombining the signals to generate the final output signal, the phase and or associated delay of the translation frequency should be known in order to reconstruct the original signal. This knowledge of the phase of the translation frequency can be passed to the process for the recombination by, for example, summing a pilot tone having a substantially predefined phase relationship to a local oscillator of the mixer used for the heterodyning process into the signal channel so that the phase of this pilot tone may be determined upon recombination, and used to compensate for any phase changes of any of the signals to be recombined. Alternatively, the heterodyning mixer phase may be locked to the sample clock, thus providing output signals to be recombined having the same phase.

EXAMPLES

The first example shows how a step can be digitized using two 5 GHz bands and low side downconversion.

$rt := .045$ risetime of edge specified ($ns$)

$f_{bw} := \dfrac{0.344}{rt}$  $f_{bw} = 7.644$ bandwith of critically damped second order system $\omega 0 := 1.5542 \cdot \pi \cdot f_{bw}$ Calculate the center frequency for the system $\dfrac{\omega 0}{2 \cdot \pi} = 11.879$ center frequency (GHz)

$TD := 5$ time delay for step edge ($ns$)

$H(s) = \dfrac{\omega 0^2}{\left(s^2 + \dfrac{\omega 0}{Q} \cdot s + \omega 0^2\right) \cdot s} \cdot e^{-s \cdot TD}$ Laplace transform of the step specified The inverse Laplace transform provides the time-domain step waveform.

$f(t) := \text{if } [t < TD, 0, [-1 - \omega 0 \cdot (t - TD)] \cdot e^{[-\omega 0 \cdot (t - TD)]} + 1]$ To simulate the behavior of the analog components, it is modeled digitally with an extremely high sample rate.

$FS_{hi} := 1000$ sample rate for simulating analog system(GHz)

$KH := 10000$  $kh := 0 \ldots KH - 1$ $th_{kh} := \dfrac{kh}{FS_{hi}}$ time of each point ($ns$)

Utilize a raised cosine window to minimize effects of the FFT.

$wh_{kh} := \dfrac{1}{2} - \dfrac{1}{2} \cdot \cos\left(2 \cdot \pi \cdot \dfrac{kh}{KH - 1}\right)$ $xh_{kh} := f(th_{kh}) \cdot wh_{kh}$ Calculate the windowed step.

$t_{10} := \dfrac{.53181160838961202015}{\omega 0} + TD$  $t_{10} = 5.007$ $t_{90} := \dfrac{3.8897201698674290579}{\omega 0} + TD$  $t_{90} = 5.052$ $t_{90} - t_{10} = 0.045$ Verify that risetime is correct.

Figure 4:
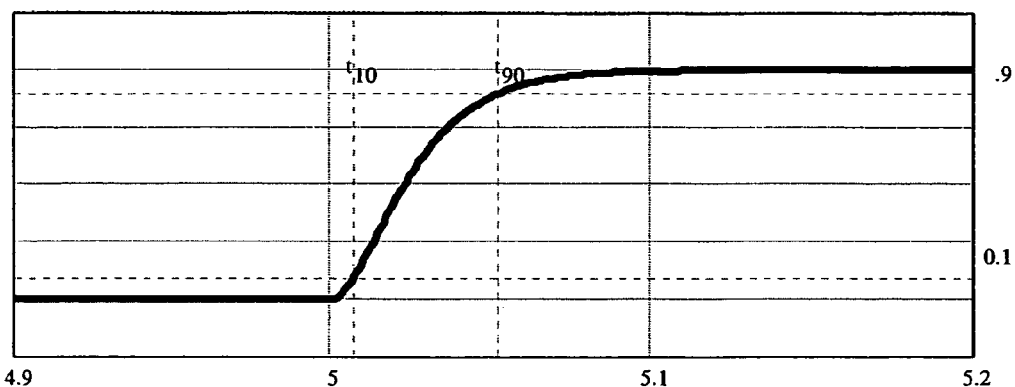
FIGS. 4–57 are useful in explaining the advantages obtained by the present invention.

FIG. 4 shows a picture of the simulated 45 ps step.

Figure 5:
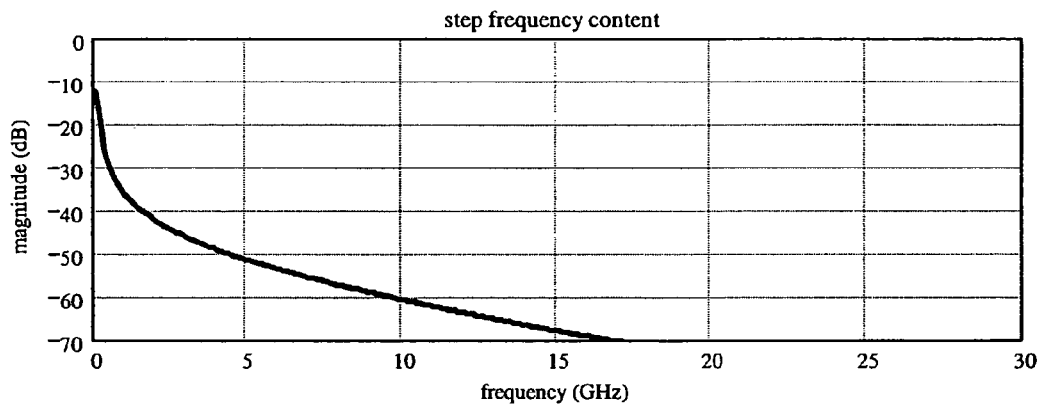

$Xh := CFFT(xh)$ Calculate the FFT $NH := \dfrac{KH}{2}$ $nh := 0 \ldots NH$ $fh_{nh} := \dfrac{nh}{NH} \cdot \dfrac{FS_{hi}}{2}$ FIG. 5 shows the frequency content of the simulated step.

As we know, the scope does not have the bandwidth to digitize this signal. Therefore, we apply the method of this invention. First, we will utilize a system bandwidth of 5 GHz. then, we develop bandpass filters that select 5 GHz bands of the signal. Note that because the system is bandlimited, it is not actually necessary to utilize bandpass filters—only high pass filters need be utilized, but bandpass filters are used to simplify the discussion. Furthermore, the first band does not even need a filter—the scopes limited bandwidth will do this for us. (inside the scope, a digital low pass filter would be utilized to provide the hard bandwidth limiting).

$BW := 5$ system bandwidth utilized for each band (GHz)
Make low pass and bandpass filters for each band.

Figure 6:
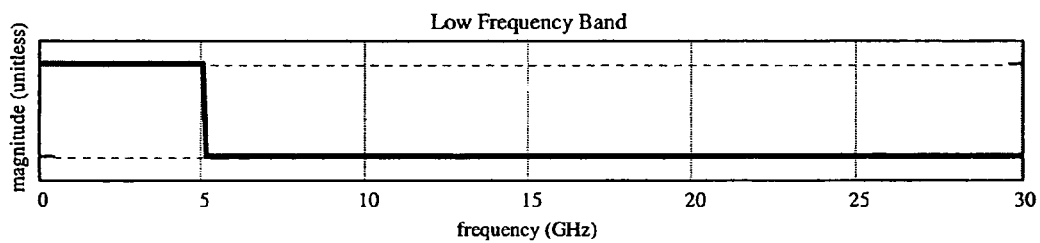

$nn := 1 \ldots NH - 1$ $Mfl_{nh} := \text{if}(fh_{nh} \leq BW, 1, 0)$ $Mfh_{nh} := \text{if}(BW < fh_{nh} \leq 2 \cdot BW, 1, 0)$ $Mfl_{NH+nn} := Mfl_{NH-nn}$ $Mfh_{NH+nn} := Mfh_{NH-nn}$ FIG. 6 shows the response of the low frequency band filter.

Figure 7:
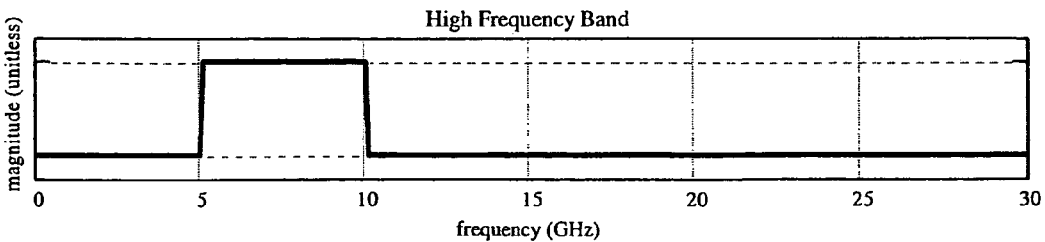

FIG. 7 shows the response of the high frequency band filter.

Apply these filters to the input waveform.

Figure 8:
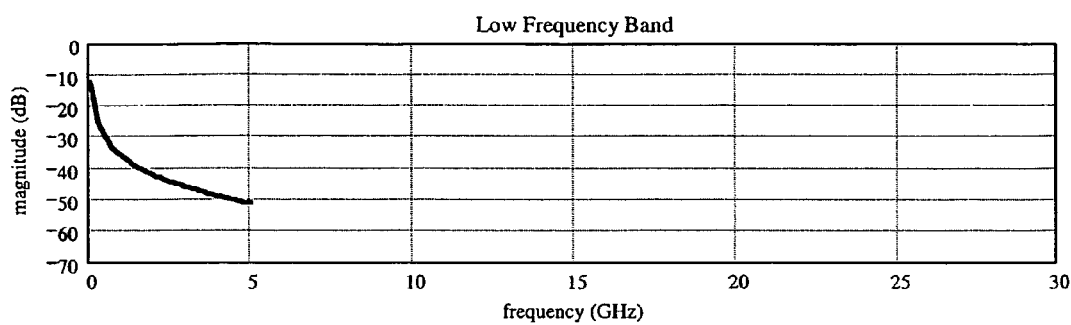

$Xfl := \overrightarrow{(Xh \cdot Mfl)}$ $Xfh := \overrightarrow{(Xh \cdot Mfh)}$ $Xf := \overrightarrow{(Xh \cdot M)}$ FIG. 8 shows the frequency domain result of applying the low frequency band filter to the simulated step.

Figure 9:
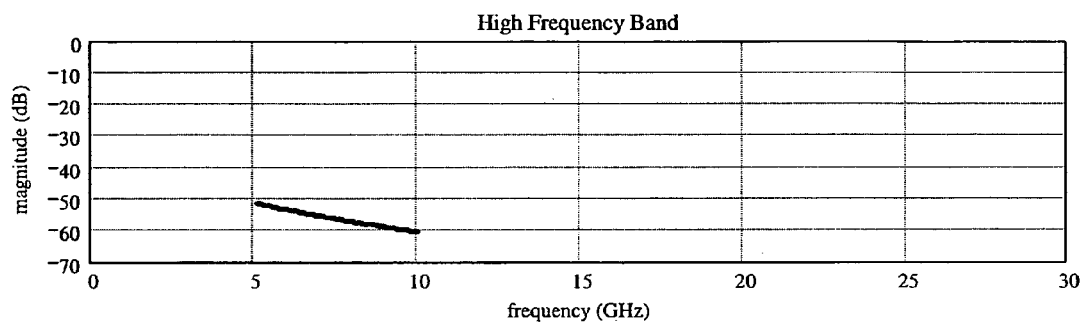

FIG. 9 shows the frequency domain result of applying the high frequency band filter to the simulated step.

Calculate the inverse FFT of these filtered bands.

$xfl := ICFFT(Xfl)$ $xfh := ICFFT(Xfh)$ $xf := ICFFT(Xf)$

Figure 10:
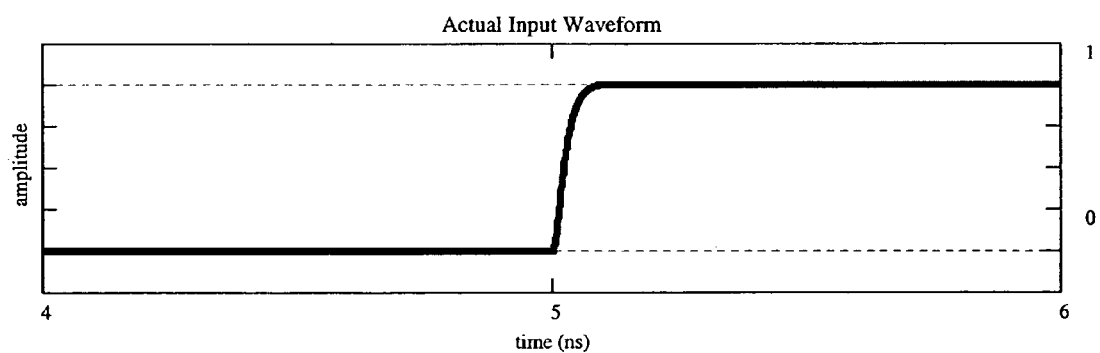

FIG. 10 shows the input waveform.

Figure 11:
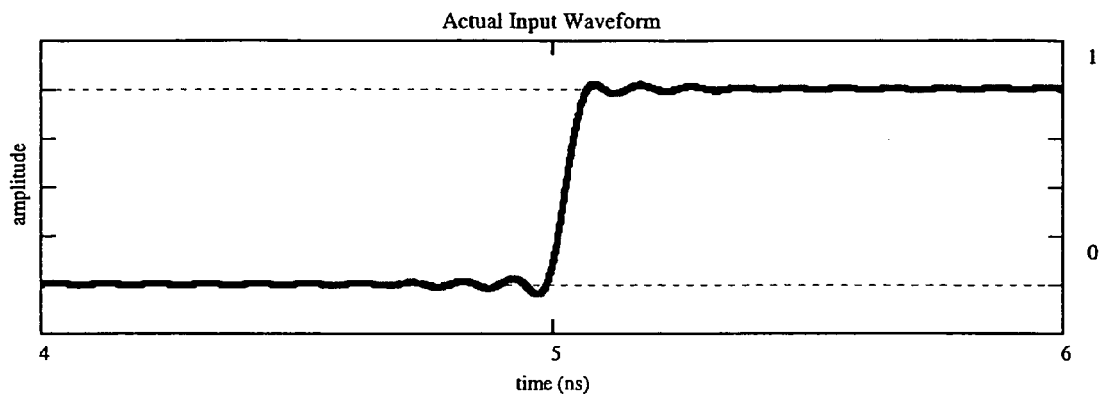

FIG. 11 shows the input waveform bandlimited to 10 GHz.

Figure 12:
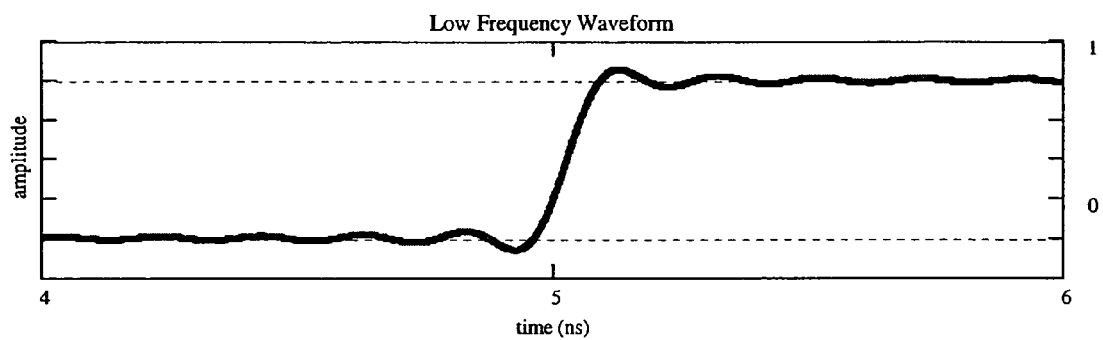

FIG. 12 shows the time domain result of applying the low frequency band filter to the simulated step.

Figure 13:
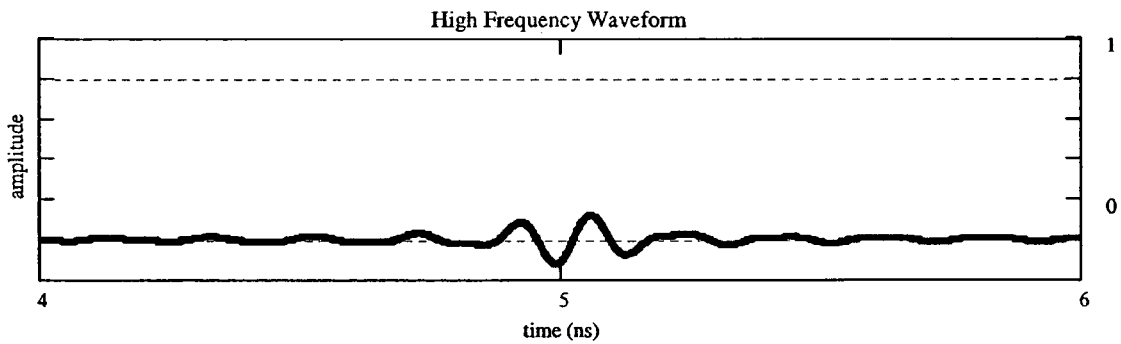

FIG. 13 shows the time domain result of applying the high frequency band filter to the simulated step.

Figure 14:
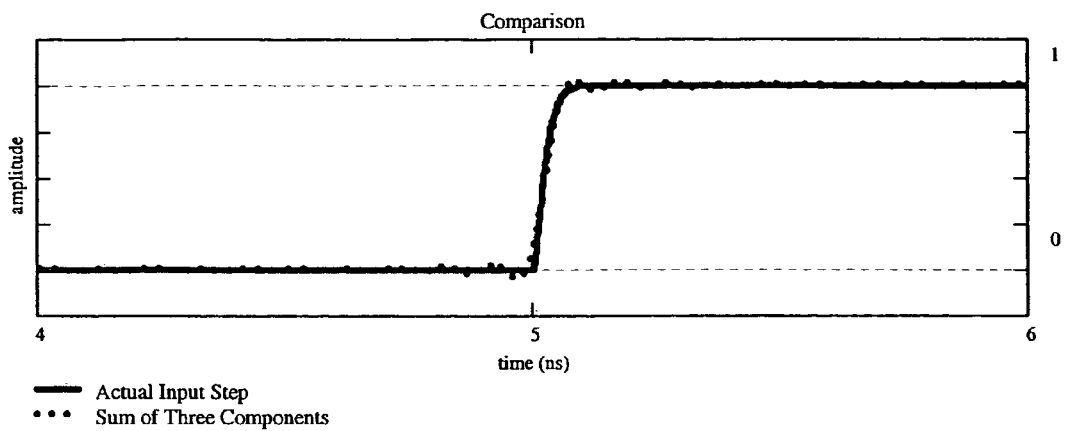

It is useful to add these two signals together and compare them to the input waveform. FIG. 14 shows this. You will note the sum is not identical to the input because the system has limited the bandwidth at 10 GHz. The 10 GHz bandwidth limited signal is the best that we will be able to provide.

Figure 15:
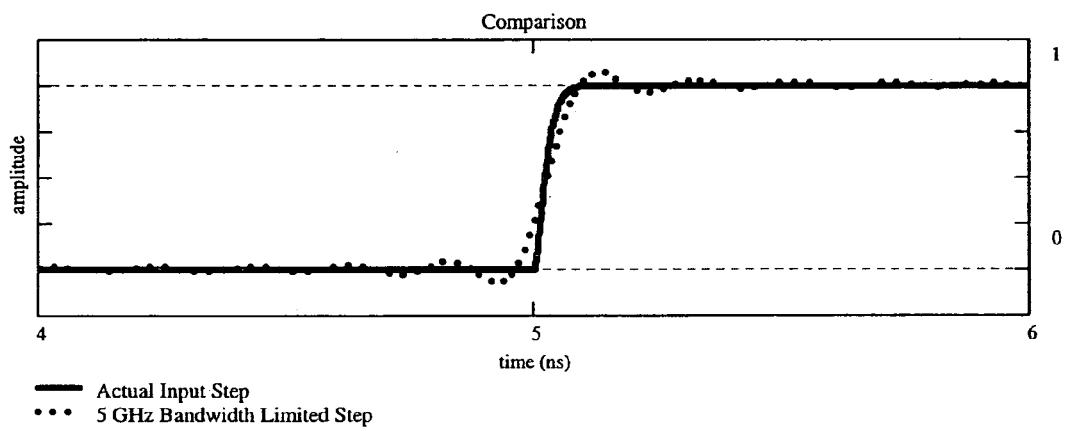

It is also useful to compare the low frequency and actual input waveforms directly. FIG. 15 shows this. The point of FIG. 15 is to demonstrate the problem that this invention is designed to solve. The limited bandwidth slows the edge of the step. This simulates the analog waveform that gets sampled by a digitizer with a front-end bandwidth of 5 GHz. Our goal is to digitize the actual waveform with a much higher bandwidth.

First, the high frequency band is applied to the mixer.

$$F_{mixer0} := 1 \cdot BW$$

$$\Phi_{mixer0} := rnd(2 \cdot \pi)$$

The frequency of the high frequency mixer is at the cutoff frequency of the first band. apply the mixer $$xfhm_{kh} := xfh_{kh} \cdot 2 \cdot \cos(2 \cdot \pi \cdot F_{mixer0} \cdot t_{kh} + \Phi_{mixer0})$$

Look at the frequency content.

$$Xfhm := CFFT(xfhm)$$

Low pass filter the mixer outputs.

$$Xfhml := \overline{(XfhmMfl)}$$

Note again that the typical manner of low pass filtering the mixer outputs would be to use the scope front-end. This filtering is being shown here as actual low pass filters applied.

Figure 16:
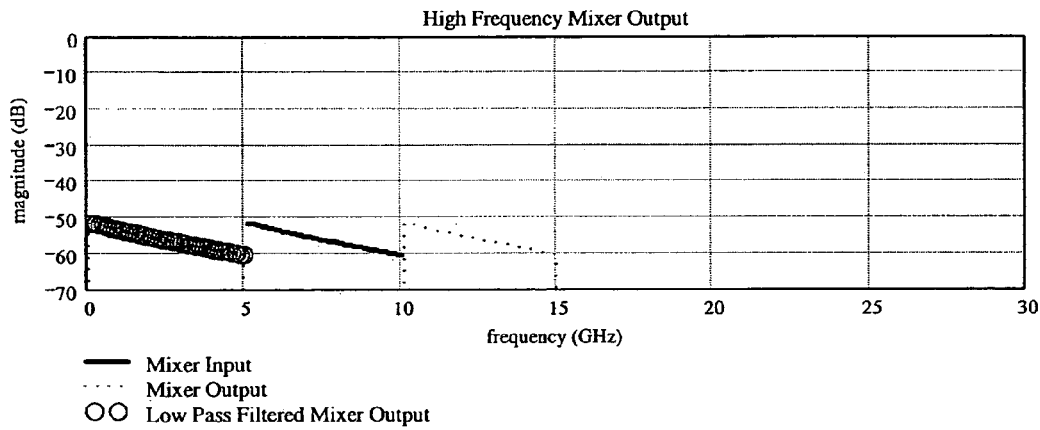

FIG. 16 shows the effect at the high frequency band mixer and image reject filter output in the frequency domain.

take the inverse FFF to generate the analog mixer output signals—the analog signals input to the channel digitizers.

$$xfhml := ICFFT(Xfhml)$$

Figure 17:
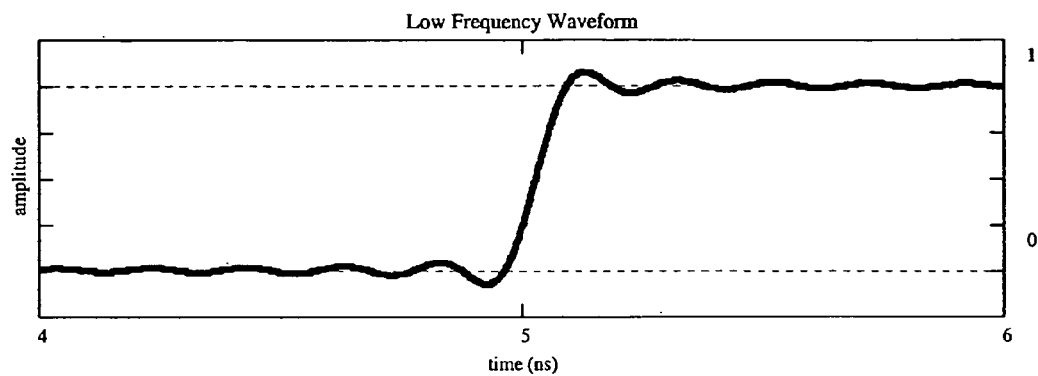
Figure 18:
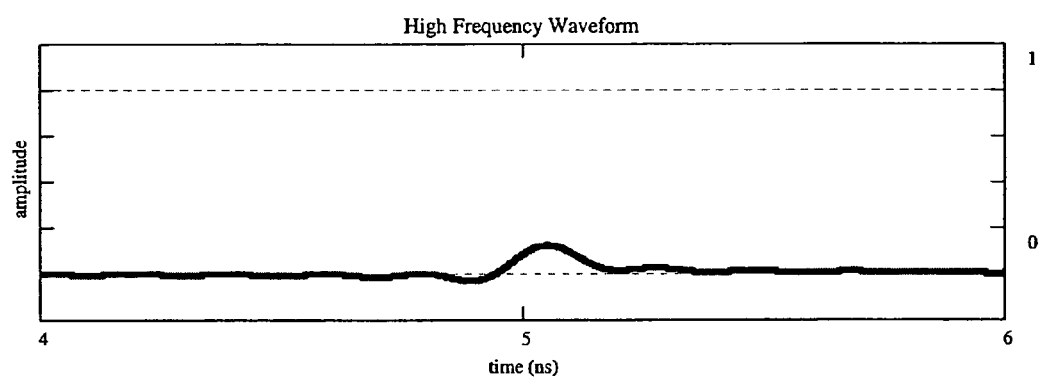

FIGS. 17 and 18 show the low frequency and high frequency band signal due to the processing of the simulated step input signal.

Figure 19:
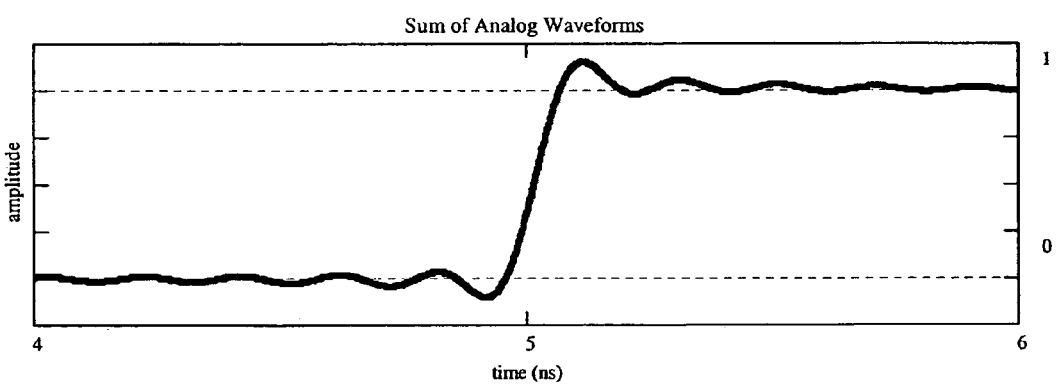

It is interesting to see the sum of these two waveforms their sum does not produce a waveform that is useful in representing the originally input waveform. This is shown in FIG. 19. This is shown to exemplify that further processing of the digitized waveforms is required to achieve the objective.

At this point, the waveforms are digitized. The waveforms must be sampled at a rate sufficient to satisfy the Nyquist Criterion. For this example, this means that they must be sampled at at least 2 times BW, or 10 GS/s. After the waveforms have been digitized, they are immediately upsampled using SinX/x interpolation. This is possible because all digitized waveforms are bandlimited. It is useful to upsample the waveforms to a sample rate capable of meeting the Nyquist Criterion for the system bandwidth—I have chosen 40 GS/s. The upsampling is trivial and for the purpose of this example, I simply use a 40 GS/s digitizer with the understanding that the exact same waveform would result from sampling the waveform at 10 GS/s and upsampling by a factor of 4.

$FS := 40$ upsampled digitizer sample rate $D := \dfrac{FS_{hi}}{FS}$  $D = 25$ upsampling factor for analog waveform model $K := \dfrac{KH}{D}$  $k := 0 \ldots K - 1$ Sample the waveforms.

$$t_k := \dfrac{k}{FS} \quad xl_k := xfl_{k \cdot D} \quad xh_k := xfhml_{k \cdot D} \quad x_k := xh_{k \cdot D} \quad w_k := wh_{k \cdot D}$$

Generally, at this point, we would apply the sharp cutoff filter. If a sharp cutoff analog filter was not used, we'd have to satisfy the Nyquist Criterion such that any extra frequency content would not fold back into the 5 GHz band. I've already applied a sharp cutoff filter to the analog signal, so this is not necessary.

Also, at this point, some magnitude and phase compensation would probably be necessary to account for non-ideal channel frequency response characteristics. This example shows the signal digitized with ideal digitizers with ideal frequency response characteristics.

Next, the high and very high frequency waveforms are mixed up to there appropriate frequency location and digitally bandpass filtered.

Note that these digital mixers know the phase of the analog mixers—some mechanism must be provided for determining this—either through a pilot tone or locking of the mixer phase to the sample clock.

Apply digital mixers $$x_{hm_k} := x_{h_k} \cdot (2 \cdot \pi F_{mixer0} \cdot t_k + \Phi_{mixer0}))$$

Bandpass filter the mixer outputs.

$$N := \dfrac{K}{2} \quad n := 0 \ldots N$$

$$f_n := \dfrac{n}{N} \cdot \dfrac{FS}{2}$$

$$Xhm := CFFT(x_{hm}) \quad Xlm := CFFT(x_l)$$

$$Xfhm_n := \text{if}(f_n < 1 \cdot BW, 0, Xhm_n) \quad Xfhm_n := \text{if}(f_n > 2 \cdot BW, 0, Xfhm_n)$$

$$nn := 1 \ldots N - 1$$

$$Xfhm_{N+nn} := \overline{Xfhm_{N-nn}}$$

$$X_h := CFFT(x_h)$$

$$X_l := CFFT(x_l)$$

Figure 20:
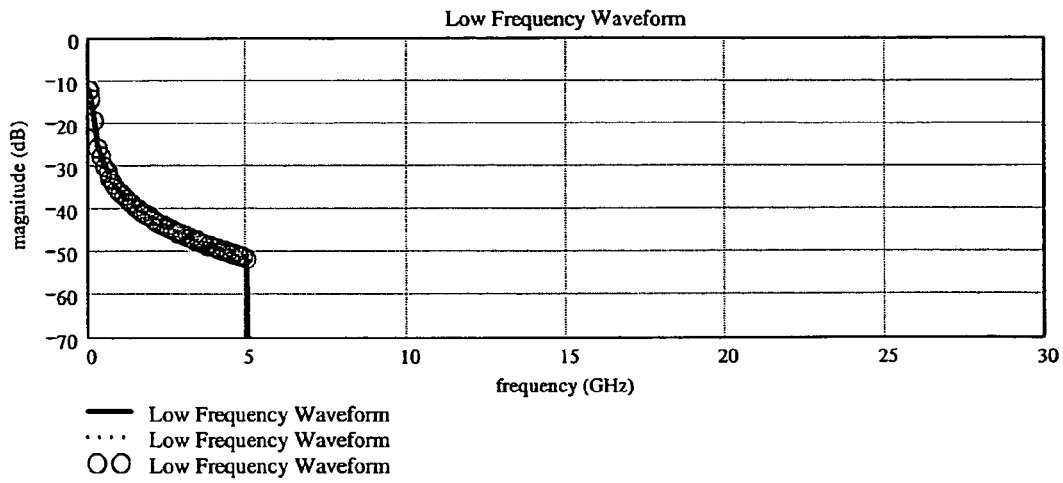

FIG. 20 shows the low frequency band waveform frequency content.

Figure 21:
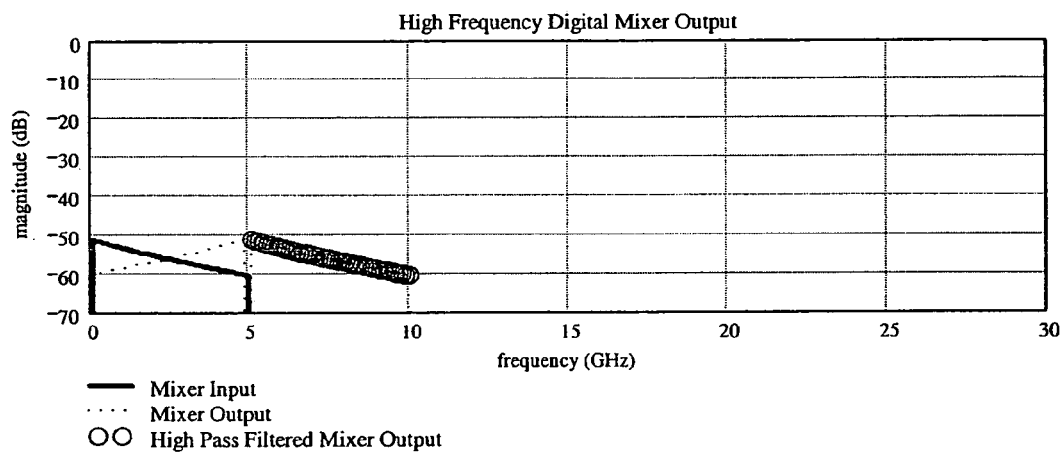

FIG. 21 shows the high frequency band waveform frequency content before and after digital mixing and filtering.

Figure 22:
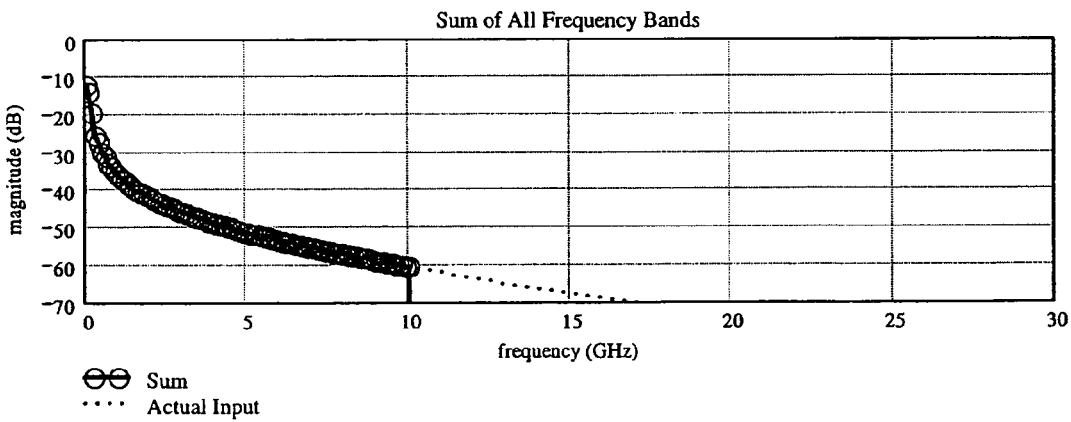

FIG. 22 shows the results of summing the output waveforms. We have acquired the waveform with a 10 GHz bandwidth utilizing two 5 GHz bandwidth channels.

Now lets see how the time domain waveforms compare.

$$xfhm := Re(ICFFT(Xfhm))$$

Figure 23:
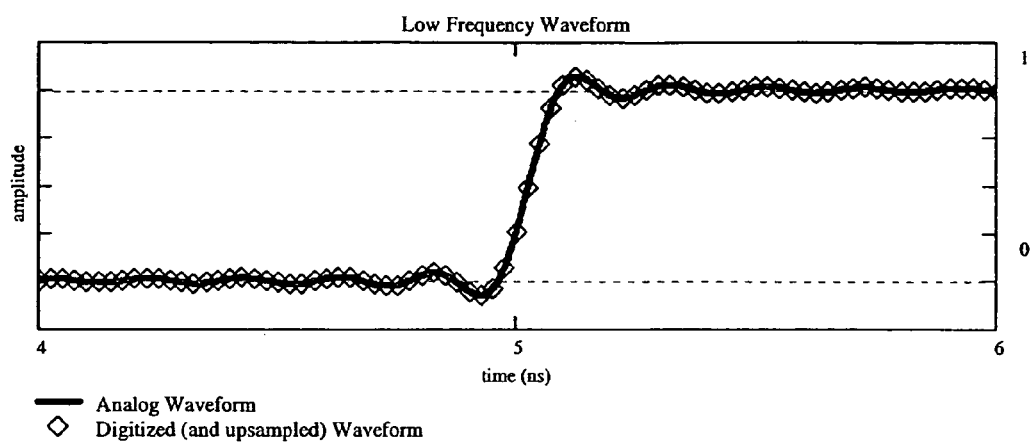

FIG. 23 shows a comparison of the analog low frequency portion of the input waveform to the digitized and processed low frequency waveform result. FIG. 23 shows that these are identical.

Figure 24:
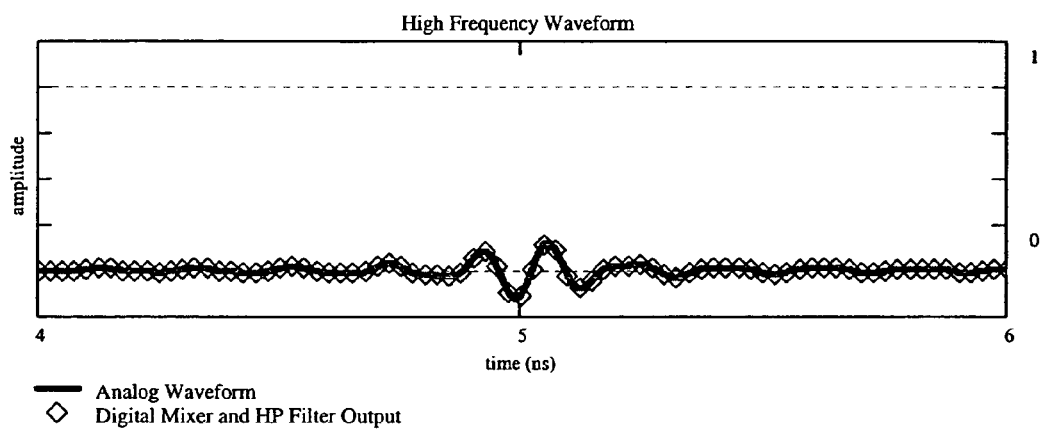

FIG. 24 shows a comparison of the analog high frequency portion of the input waveform to the mixed, digitized and digitally remixed and processed high frequency waveform result. FIG. 24 shows that these are identical.

Figure 25:
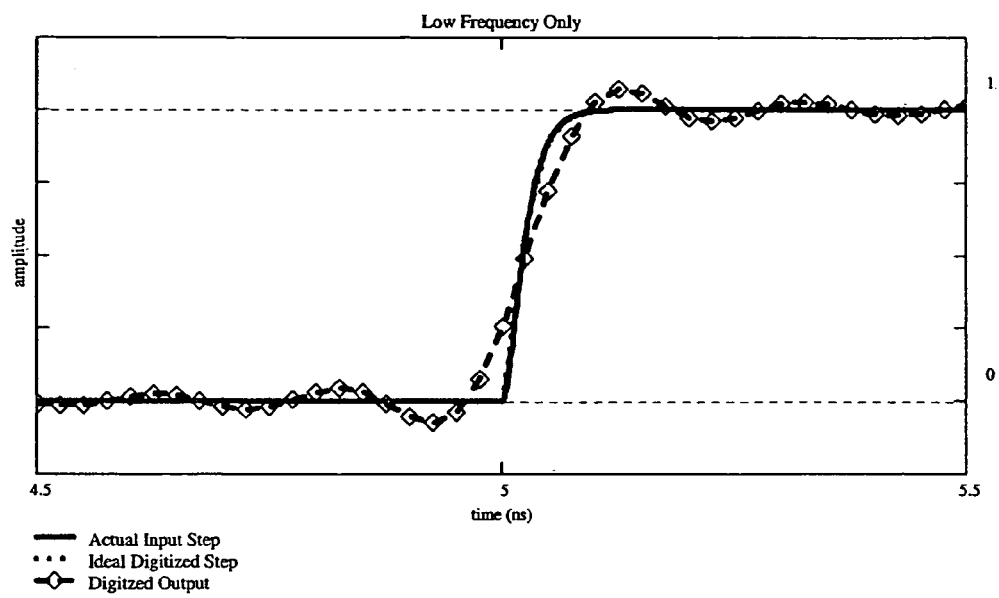
Figure 26:
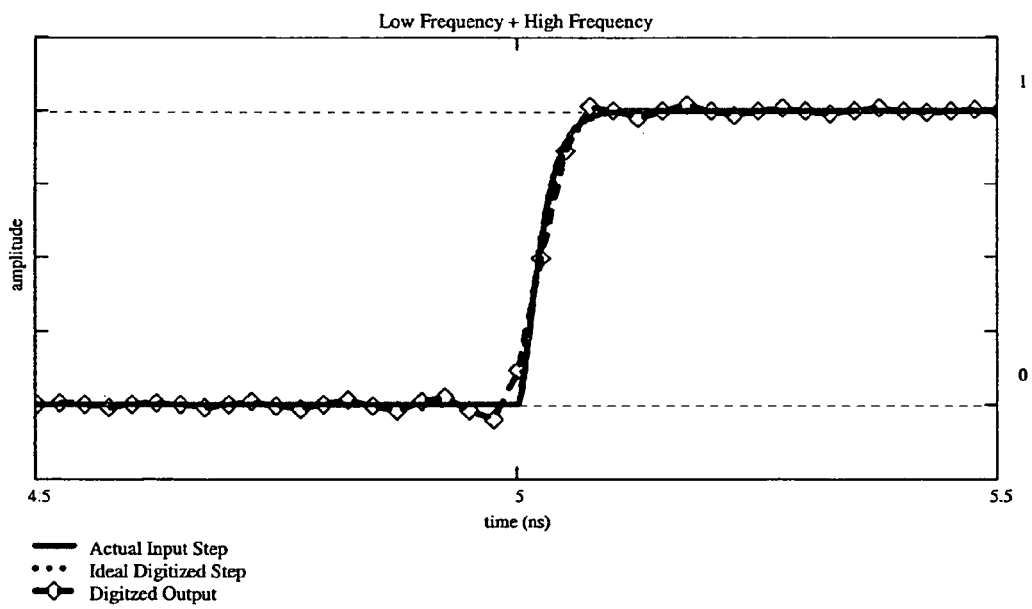

FIGS. 25 and 26 show how successive addition of the processed band outputs causes the resulting waveform to more and more closely approximate the input waveform. FIG. 26 shows that the result is identical to the input waveform band limited to 10 GHz and shows that the 10 GHz bandwidth limited step is fully recreated.

The second example shows how a step can be digitized using three 5 GHz bands and high side downconversion.

$rt = .035$ risetime of edge specified (ns)

$f_{bw} = \dfrac{0.344}{rt}$   $f_{bw} = 9.829$ $\omega 0 = 1.5542 \cdot \pi \cdot f_{bw}$   Calculate the center frequency for the system.

$\dfrac{\omega 0}{2 \cdot \pi} = 15.274$ center frequency (GHz)

$TD = 5$ time delay for step edge (ns)

$H(s) =$ $\dfrac{\omega 0^2}{\left(s^2 + \dfrac{\omega 0}{Q} \cdot s + \omega 0^2\right) \cdot s} \cdot e^{-s \cdot TD}$ Laplace transform of the step specified The inverse Laplace transform provides the time-domain step waveform.

$f(t) = \text{if}[t<TD, 0, [-1 - \omega 0 \cdot (t-TD)] \cdot e^{[-\omega 0 \cdot (t-TD)]} + 1]$ To simulate the behavior of the analog components, it is modeled digitally with an extremely high sample rate.

$FS_{hi} = 1000$ sample rate for simulating analog system (GHz)

$KH = 10000$   $kh = 0 \ldots KH - 1$ $th_{kh} = \dfrac{kh}{FS_{hi}}$ time of each point (ns)

Utilize a raised cosine window to minimize effects of the FFT.

$wh_{kh} = \dfrac{1}{2} - \dfrac{1}{2} \cdot \cos\left(2 \cdot \pi \cdot \dfrac{kh}{KH-1}\right)$ $xh_{kh} = f(th_{kh}) \cdot wh_{kh}$ Calculate the windowed step.

$t_{10} = \dfrac{.53181160838961202015}{\omega 0} + TD$   $t_{10} = 5.006$ $t_{90} = \dfrac{3.8897201698674290579}{\omega 0} + TD$   $t_{90} = 5.041$ $t_{90} - t_{10} = 0.035$ Verify that risetime is correct.

Figure 27:
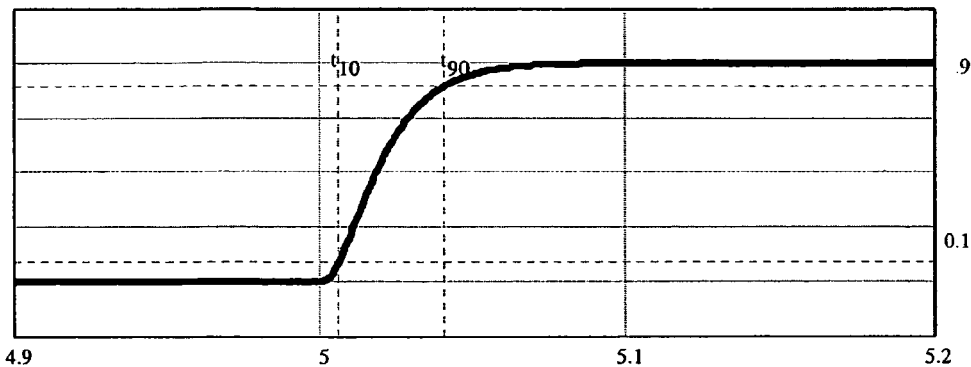

FIG. 27 shows a picture of the simulated 35 ps step.

Figure 28:
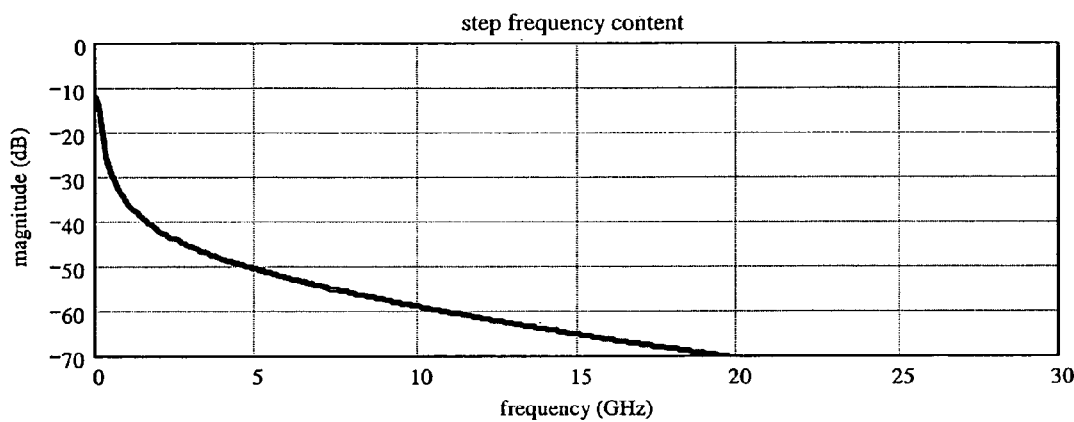

$Xh = CFFT(xh)$ Calculate the FFT $NH = \dfrac{KH}{2}$   $nh = 0 \ldots NH$   $fh_{nh} = \dfrac{nh}{NH} \cdot \dfrac{FS_{hi}}{2}$ FIG. 28 shows the frequency content of the simulated step.

As we know, the scope does not have the bandwidth to digitize this signal. Therefore, we apply the method of this invention. First, we will utilize a system bandwidth of 5 GHz. then, we develop bandpass filters that select 5 GHz bands of the signal. Note that because the system is band-limited, it is not actually necessary to utilize bandpass filters—only high pass filters need be utilized, but bandpass filters are used to simplify the discussion. Furthermore, the first band does not even need a filter—the scopes limited bandwidth will do this for us. (inside the scope, a digital low pass filter would be utilized to provide the hard bandwidth limiting).

$BW = 5$ system bandwidth utilized for each band (GHz)
Make low pass and bandpass filters for each band.

Figure 29:
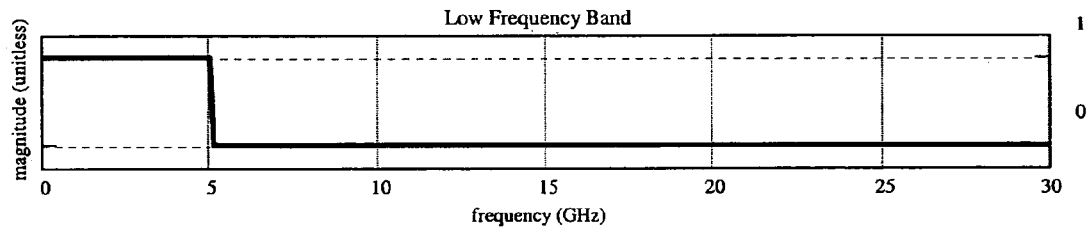

$nn = 1 \ldots NH-1$ $Mfl_{nh} = \text{if}(fh_{nh} \leq BW, 1, 0)$   $Mfl_{NH+nn} = Mfl_{NH-nn}$ FIG. 29 shows the response of the low frequency band filter.

Figure 30:
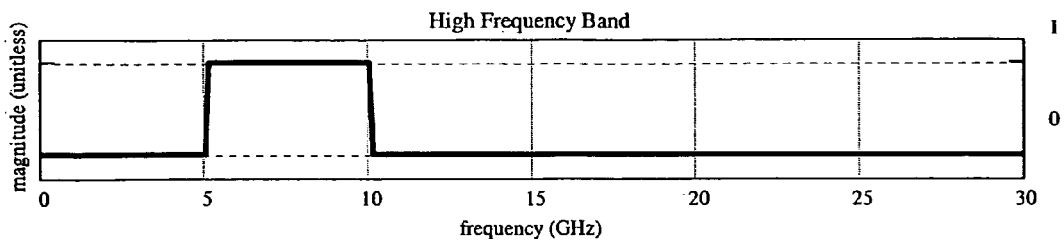

$Mfh_{nh} = \text{if}(BW < fh_{nh} \leq 2 \cdot BW, 1, 0)$   $Mfh_{NH+nn} = Mfh_{NH-nn}$ FIG. 30 shows the response of the high frequency band filter.

Figure 31:
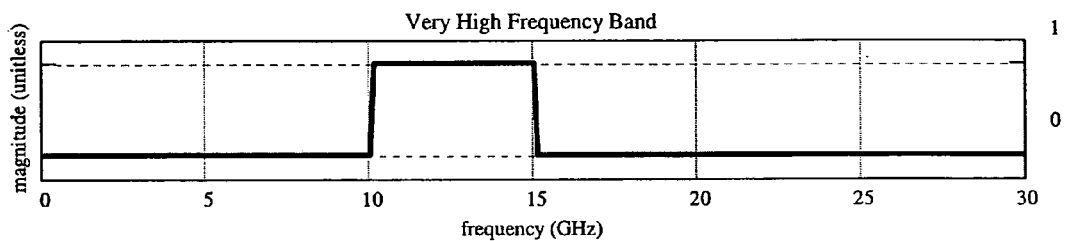

$Mfhh_{NH+nn} = Mfhh_{NH-nn}$ $Mfhh_{nh} = \text{if}(2 \cdot BW < fh_{nh} \leq 3 \cdot BW, 1, 0)$ FIG. 31 shows the response of the very high frequency band filter.

Apply these filters to the input waveform.

Figure 32:
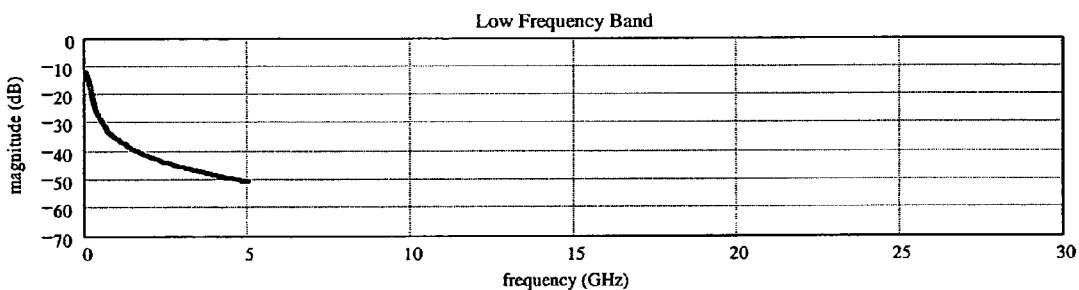

$Xfl = \overrightarrow{(Xh \cdot Mfl)}$ $Xfh = \overrightarrow{(Xh \cdot Mfh)}$ $Xfhh = \overrightarrow{(Xh \cdot Mfhh)}$ $Xf = \overrightarrow{(Xh \cdot M)}$ FIG. 32 shows the frequency domain result of applying the low frequency band filter to the simulated step.

Figure 33:
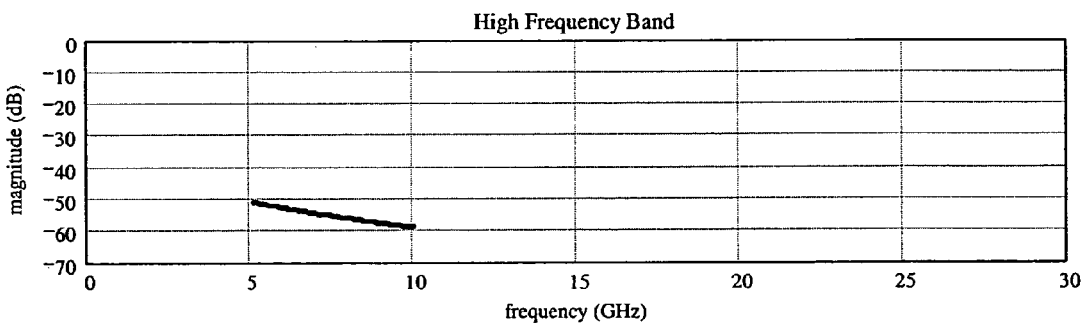
Figure 34:
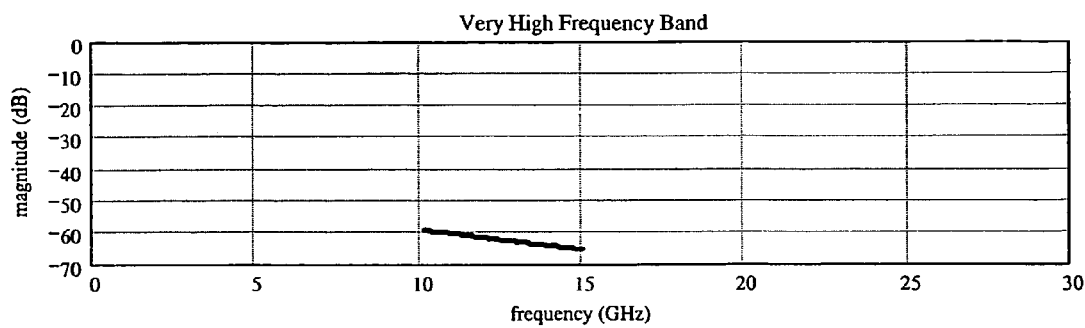

FIG. 33 shows the frequency domain result of applying the high frequency band filter to the simulated step FIG. 34 shows the frequency domain result of applying the very high frequency band filter to the simulated step.

Calculate the inverse FFT of these filtered bands.

$xfl = ICFFT(Xfl)$ $xfh = ICFFT)(Xfh)$ $xfhh = ICFFT(Xfhh)$ $xf = ICFFT(Xf)$

Figure 35:
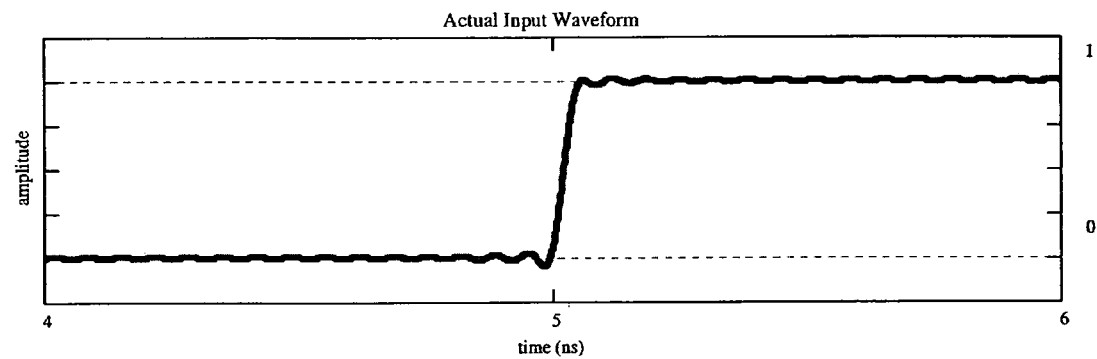

FIG. 35 shows the band limited input waveform.

Figure 36:
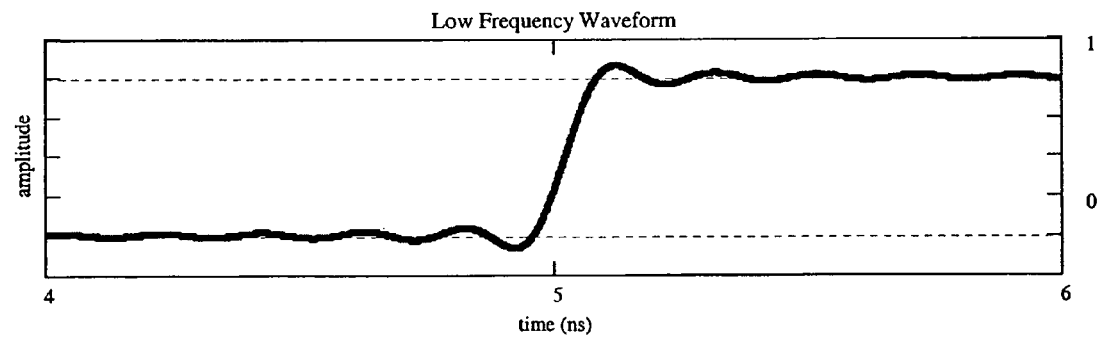

FIG. 36 shows the time domain result of applying the low frequency band filter to the simulated step.

Figure 37:
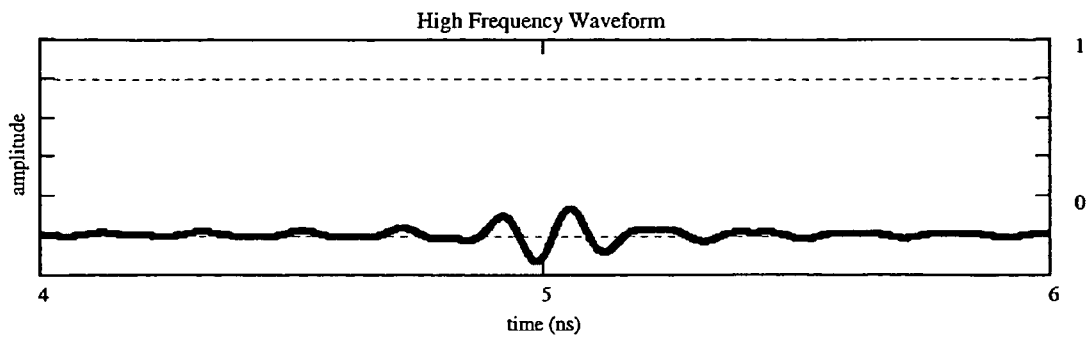

FIG. 37 shows the time domain result of applying the high frequency band filter to the simulated step.

Figure 38:
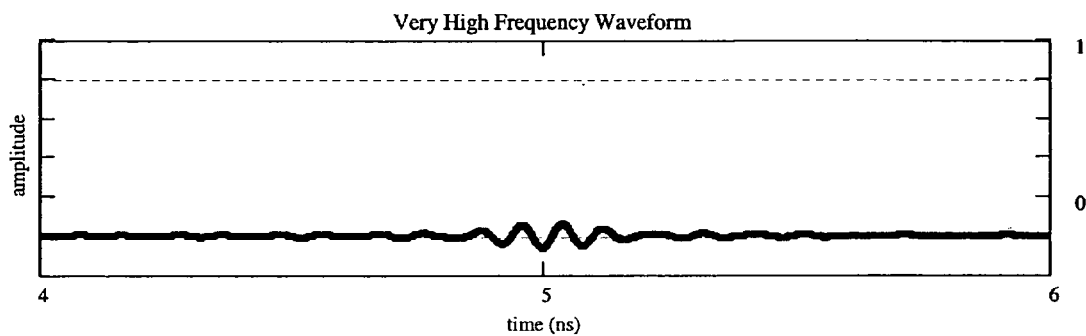

FIG. 38 shows the time domain result of applying the very high frequency band filter to the simulated step.

Figure 39:
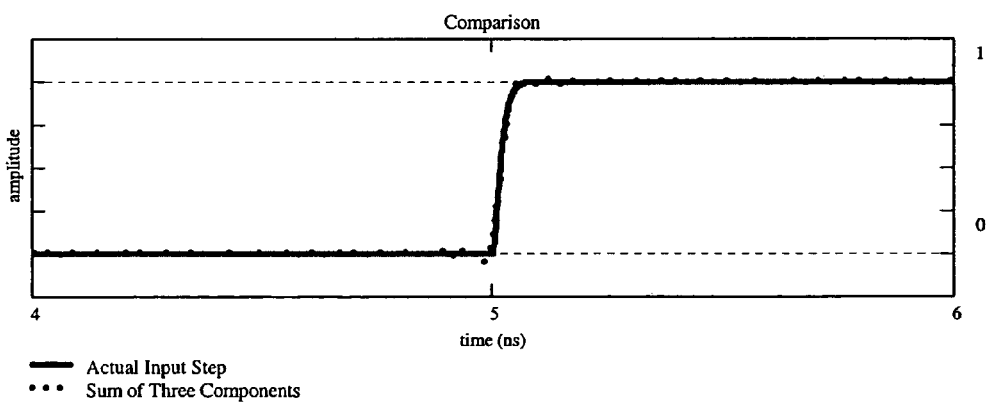

It is useful to add these three signals together and compare them to the input waveform. FIG. 39 shows this. You will note the sum is not identical to the input because the system has limited the bandwidth at 15 GHz. The 15 GHz bandwidth limited signal is the best that we will be able to provide.

Figure 40:
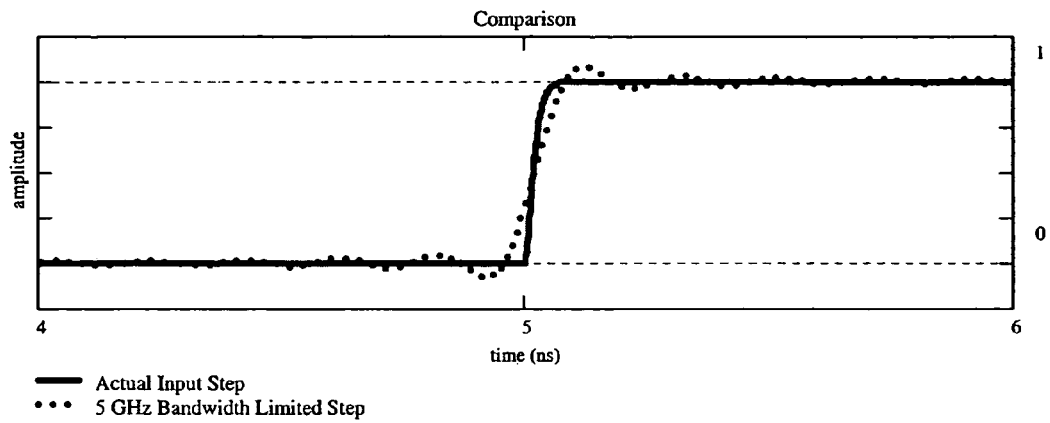

It is also useful to compare the low frequency and actual input waveforms directly. FIG. 40 shows this. The point of FIG. 40 is to demonstrate the problem that this invention is designed to solve. The limited bandwidth slows the edge of the step. This simulates the analog waveform that gets sampled by a digitizer with a front-end bandwidth of 5 GHz. Our goal is to digitize the actual waveform with a much higher bandwidth. First, the high frequency and very high frequency bands are applied to the mixers.

$$F_{mixer0} = BW \quad \Phi_{mixer0} = rnd(2\cdot\pi)$$

The frequency of the high frequency mixer is at the twice the cutoff frequency of the first band. The frequency of the very high frequency mixer is three times the cutoff frequency of the first band.

$$F_{mixer1} = 2 \cdot BW$$

$$\Phi_{mixer1} = rnd(2\cdot\pi)$$

Apply the mixers.

$$xfhm_{kh} = xfh_{kh} \cdot 2 \cdot \cos(2\cdot\pi\cdot F_{mixer0} t^h_{kh} + \Phi_{mixer0})$$
$$xfhhm_{kh} = xfhh_{kh} \cdot 2 \cdot \cos(2\cdot\pi\cdot F_{mixer1} t^h_{kh} + \Phi_{mixer1})$$

Look at the frequency content.

$$Xfhm = CFFT(xfhm)$$

$$Xfhhm = CFFT(xfhhm)$$

Low pass filter the mixer outputs.

$$Xfhml = \overrightarrow{(XfhmMfl)}$$

$$Xfhhml = \overrightarrow{(XfhhmMfl)}$$

Note again that the typical manner of low pass filtering the mixer outputs would be to use the scope front-end. This filtering is being shown here as actual low pass filters applied.

Figure 41:
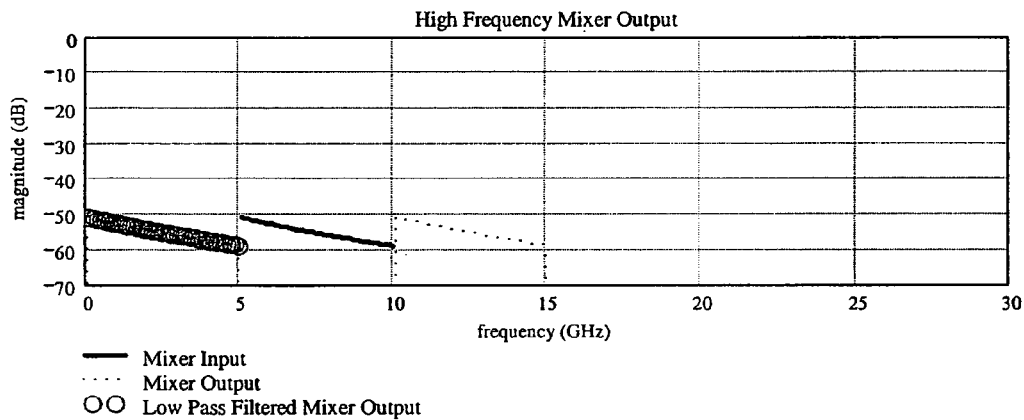

FIG. 41 shows the effect at the high frequency band mixer and image reject filter output in the frequency domain.

Figure 42:
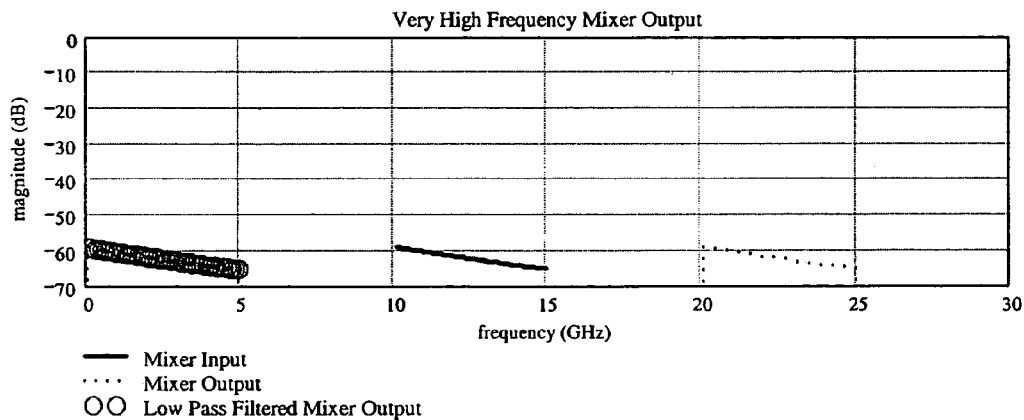

FIG. 42 shows the effect at the very high frequency band mixer and image reject filter output in the frequency domain.

Take the inverse FFT to generate the analog mixer output signals—the analog signals input to the channel digitizers.

$$xfhml = ICFFT(Xfhml)$$

$$xfhhml = ICFFT(Xfhhml)$$

Figure 43:
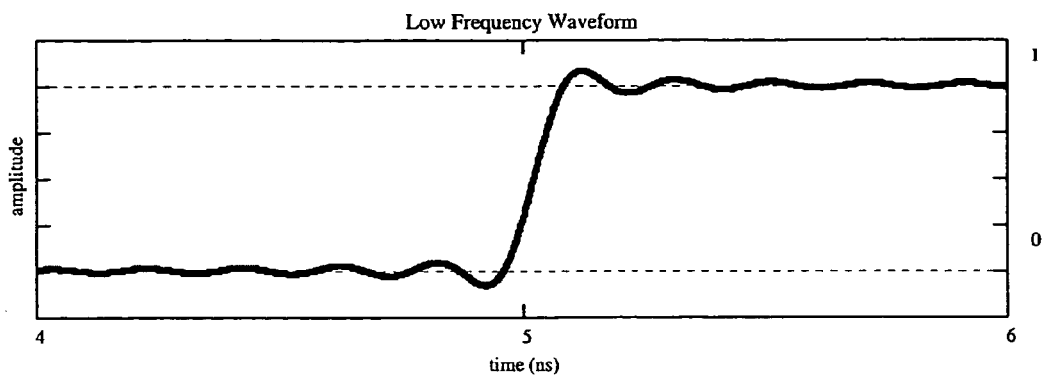
Figure 44:
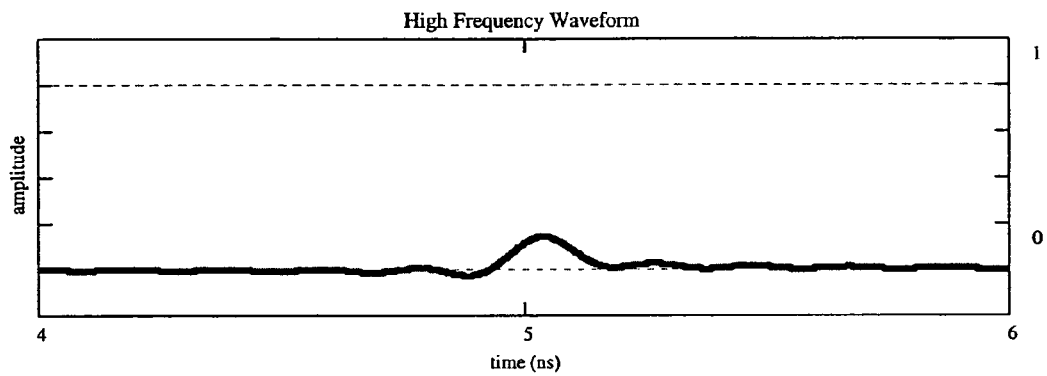
Figure 45:
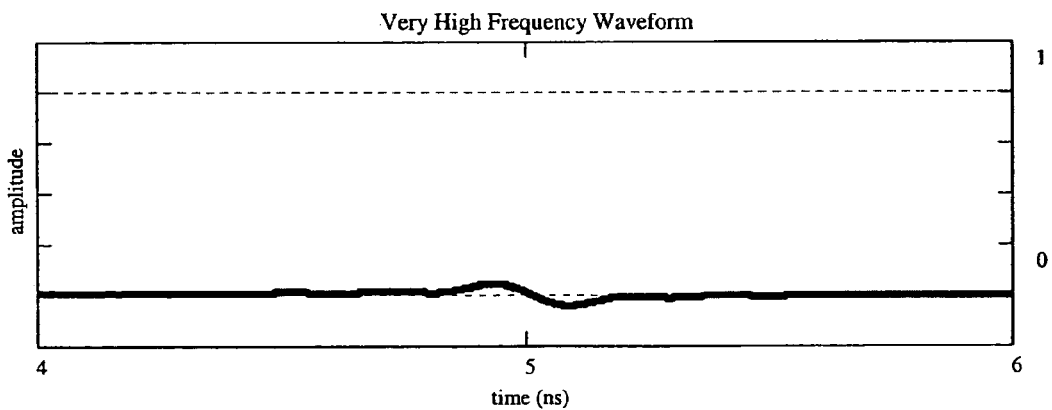

FIGS. 43, 44 and 45 show the low frequency, high frequency, and very high frequency band digitizer input signal due to the processing of the simulated step input signal.

Figure 46:
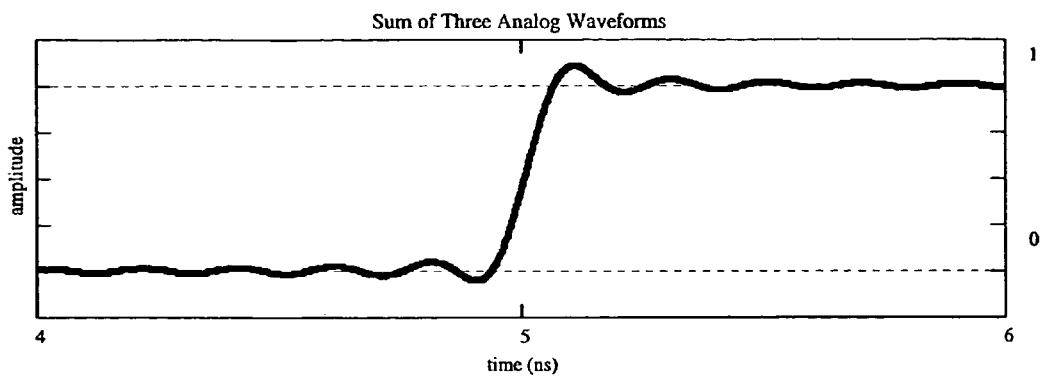

It is interesting to see the sum of these three waveforms their sums do not produce a waveform that is useful in representing the originally input waveform. This is shown in FIG. 46. This is shown to exemplify that further processing of the digitized waveforms is required to achieve the objective.

At this point, the waveforms are digitized. The waveforms must be sampled at a rate sufficient to satisfy the Nyquist Criterion. For this example, this means that they must be sampled at least 2 times BW, or 10 GS/s. After the waveforms have been digitized, they are immediately unsampled using SinX/x interpolation. This is possible because all digitized waveforms are bandlimited. It is useful to unsample the waveforms to a sample rate capable of meeting the Nyquist Criterion for the system bandwidth—I have chosen 40 GS/s. The upsampling is trivial and for the purpose of this example, I simply use a 40 GS/s digitizer with the understanding that the exact same waveform would result from sampling the waveform at 10 GS/s and upsampling by a factor of 4.

$$FS = 40 \quad \text{upsampled digitizer sample rate}$$

$$D = \frac{FS_{hi}}{FS} \quad D = 25 \text{ upsampling factor for analog waveform model}$$

$$K = \frac{KH}{D} \quad k = 0 \ldots K-1$$

Sample the waveforms $$t_k = k/FS$$

$$x_{l_k} = xfl_{k\cdot D}$$

$$x_{h_k} = xfhml_{k\cdot D}$$

$$x_k = xh_{k\cdot D}$$

$$w_k = wh_{k\cdot D}$$

$$x_{hh_k} = xfhhml_{k\cdot D}$$

Generally, at this point, we would apply the sharp cutoff filter. If a sharp cutoff analog filter was not used, we'd have to satisfy the Nyquist Criterion such that any extra frequency content would not fold back into the 5 GHz band. I've already applied a sharp cutoff filter to the analog signal, so this is not necessary.

Also, at this point, some magnitude and phase compensation would probably be necessary to account for non-ideal channel frequency response characteristics. This example shows the signal digitized with ideal digitizers with ideal frequency response characteristics. Next, the high and very high frequency waveforms are mixed up to there appropriate frequency location and digitally bandpass filtered.

Note that these digital mixers know the phase of the analog mixers—some mechanism must be provided for determining this—either through a pilot tone or locking of the mixer phase to the sample clock.

Apply digital mixers.

$$x_{hm_k} = x_{h_k} \cdot (2 \cdot \cos(2\cdot\pi\cdot F_{mixer0} t_k + \Phi_{mixer0}))$$

$$x_{hhm_k} = x_{hh_k} \cdot (2 \cdot \cos(2\cdot\pi\cdot F_{mixer1} t_k + \Phi_{mixer1}))$$

Bandpass filter the mixer outputs.

$$N = \frac{K}{2}$$

$$n = 0 \ldots N$$

$$f_n = \frac{n}{N} \cdot \frac{FS}{2}$$

$$Xhm = CFFT(x_{hm}) \quad Xhhm = CFFT(x_{hhm}) \quad Xlm = CFFT(x_l)$$

$$Xfhm_n = if(f_n > BW, Xhm_n, 0) \quad Xfhhm_n = if(f_n > 2\cdot BW, Xhhm_n, 0)$$

$$nn = 1 \ldots N-1$$

$$Xfhm_{N+nn} = \overline{Xfhm_{N-nn}} \quad Xfhhm_{N+nn} = \overline{Xfhhm_{N-nn}}$$

$$X_h = CFFT(x_h) \quad X_l = CFFT(x_l) \quad X_{hh} = CFFT(x_{hh})$$

Figure 47:
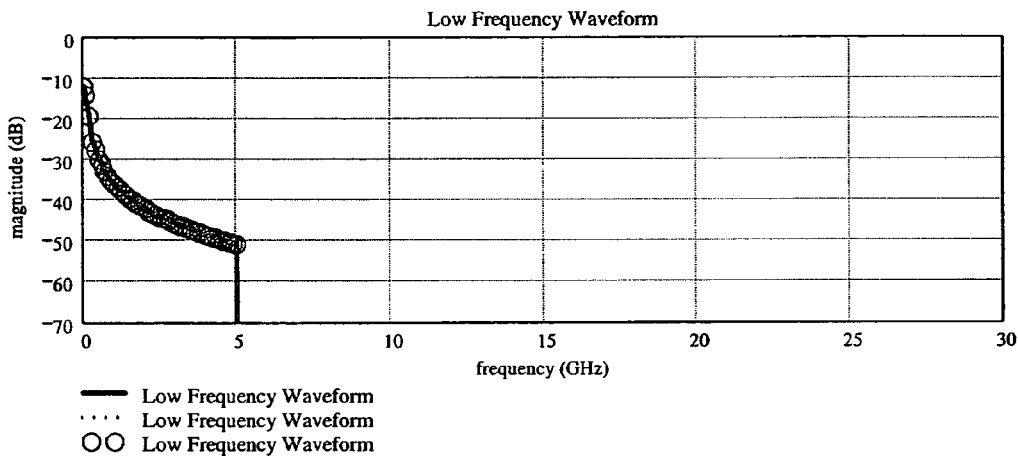

FIG. 47 shows the low frequency band waveform frequency content.

Figure 48:
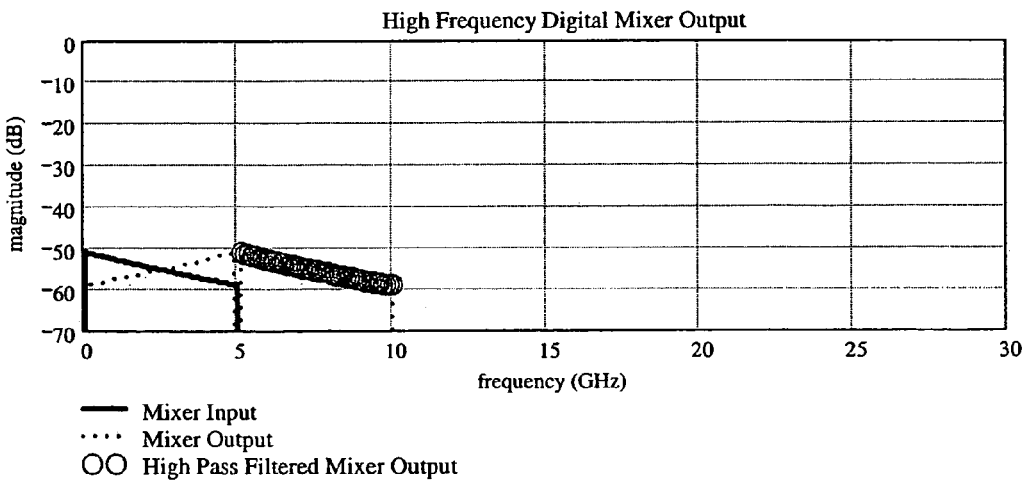

FIG. 48 shows the high frequency band waveform frequency content before and after digital mixing and filtering.

Figure 49:
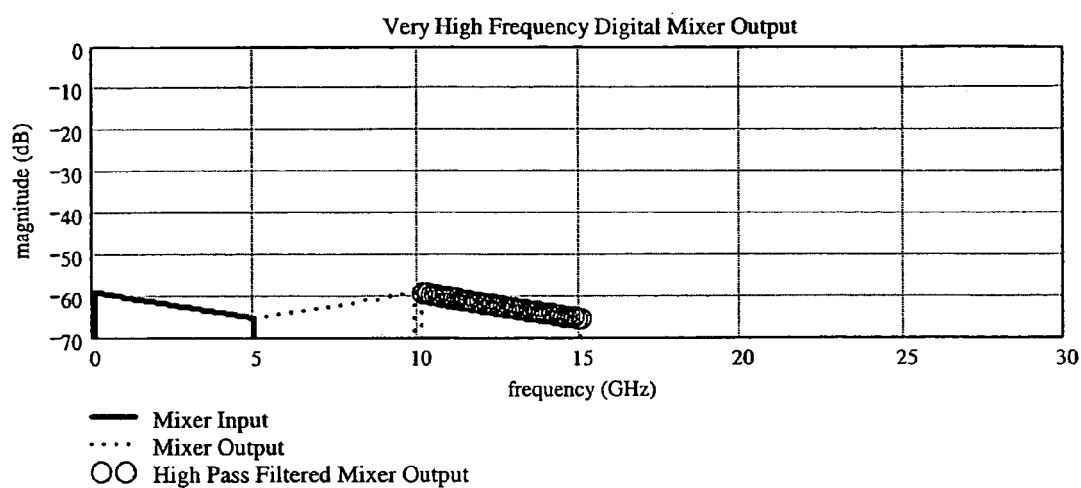

FIG. 49 shows the very high frequency band waveform frequency content before and after digital mixing and filtering.

Figure 50:
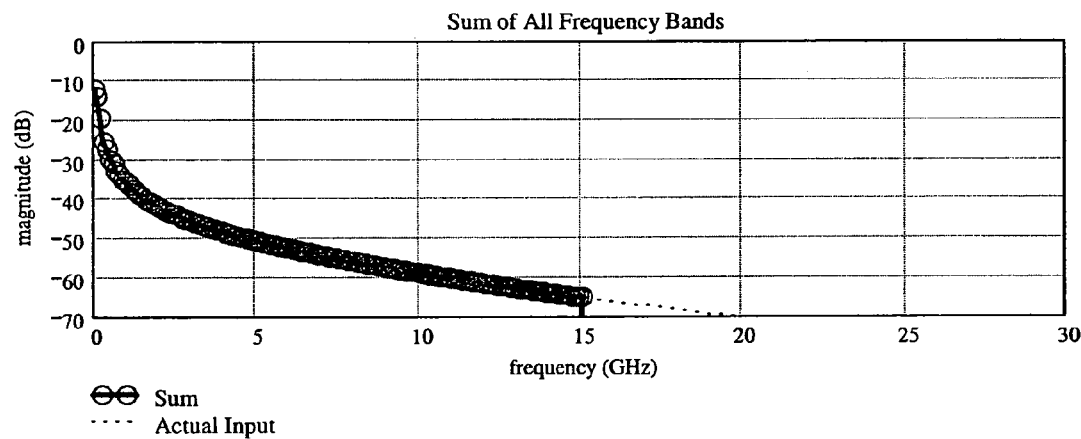

FIG. 50 shows the results of summing the output waveforms. We have acquired the waveform with a 15 GHz bandwidth utilizing three 5 GHz channels.

Now let's see how the time domain waveforms compare.

$xfhm=Re(ICFFT(Xfhm))$ $xfhhm=Re(ICFFT(Xfhhm))$

Figure 51:
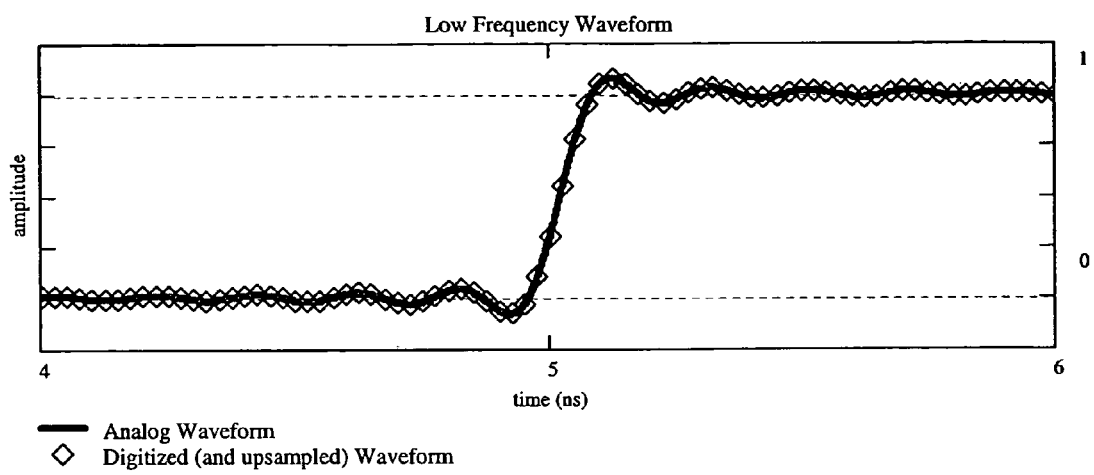

FIG. 51 shows a comparison of the analog low frequency portion of the input waveform to the digitized and processed low frequency waveform result. FIG. 51 shows that these are identical.

Figure 52:
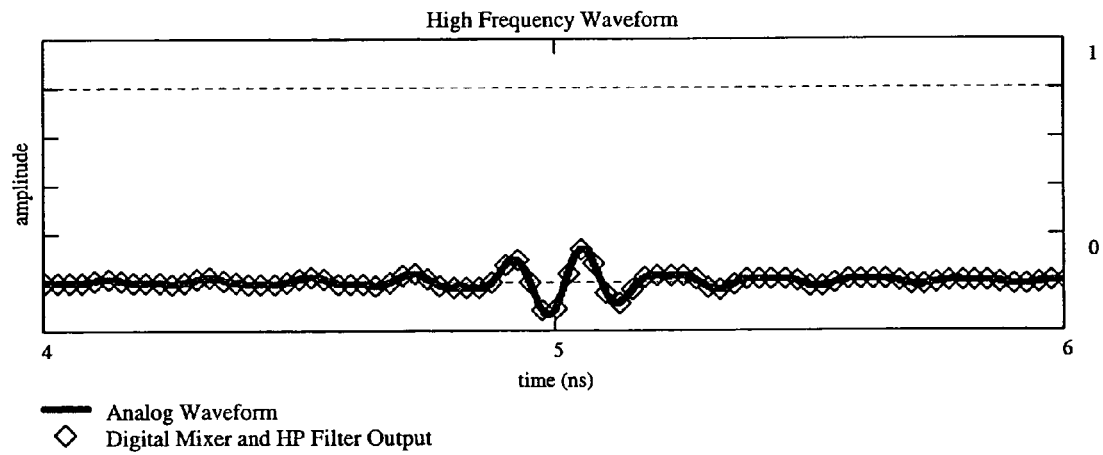

FIG. 52 shows a comparison of the analog high frequency portion of the input waveform to the mixed, digitized and digitally remixed and processed high frequency waveform result. FIG. 52 shows that these are identical.

Figure 53:
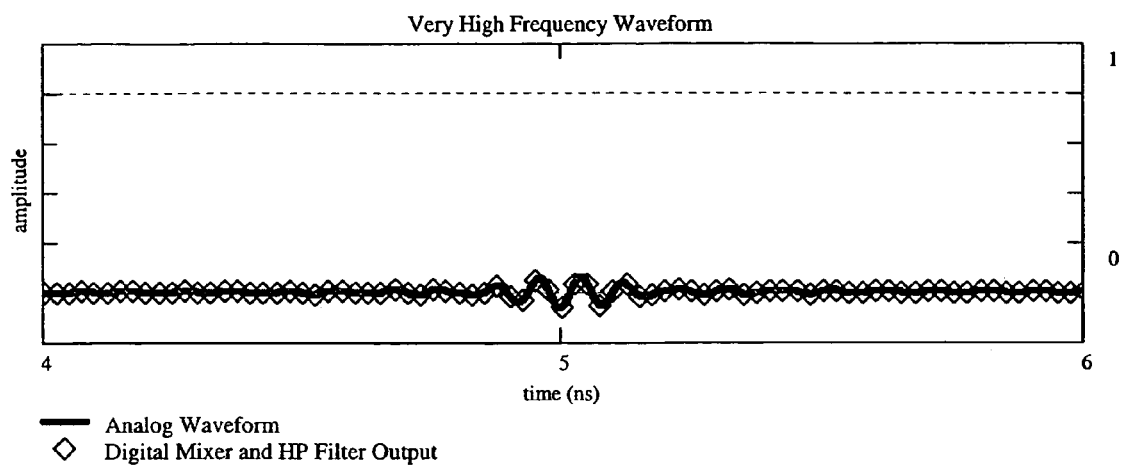

FIG. 53 shows a comparison of the analog very high frequency portion of the input waveform to the mixed, digitized and digitally remixed and processed very high frequency waveform result. FIG. 53 shows that these are identical.

Figure 54:
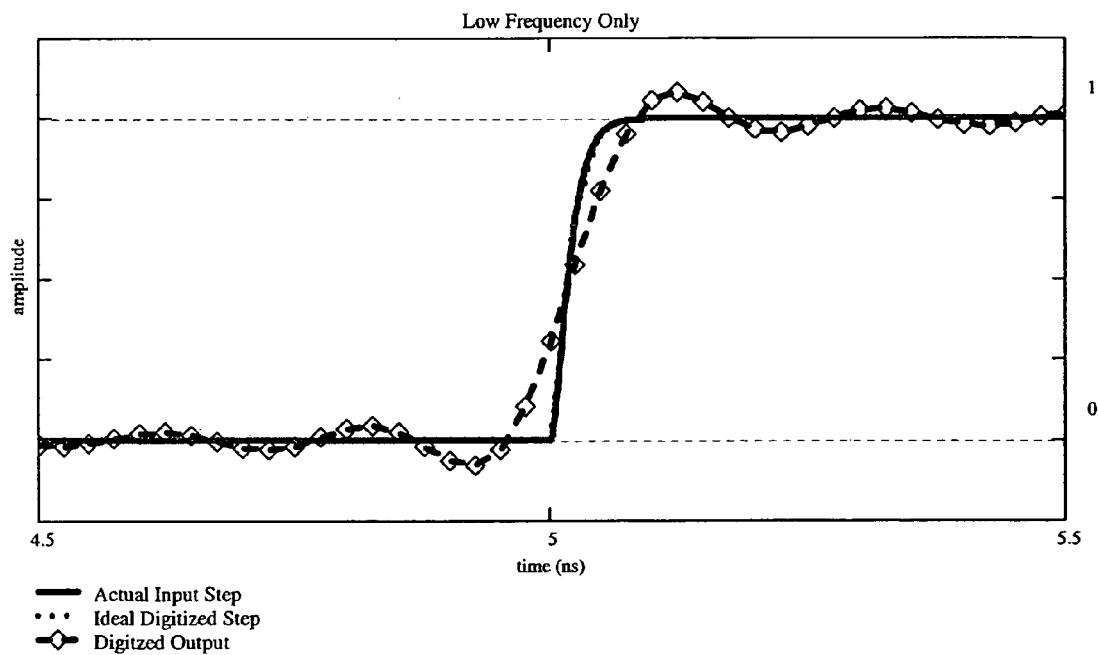
Figure 55:
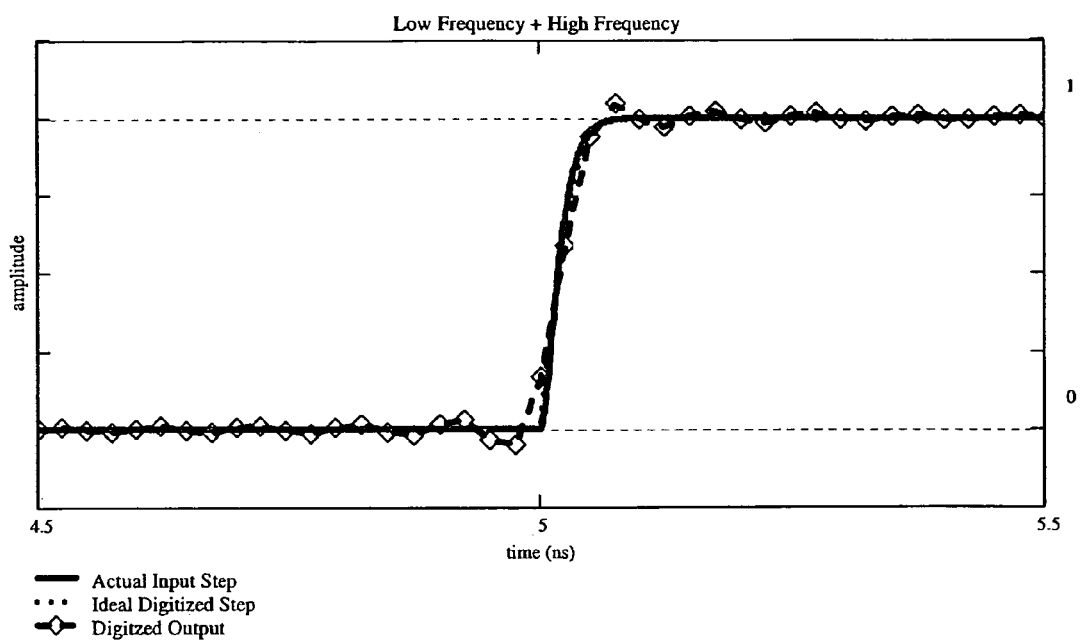
Figure 56:
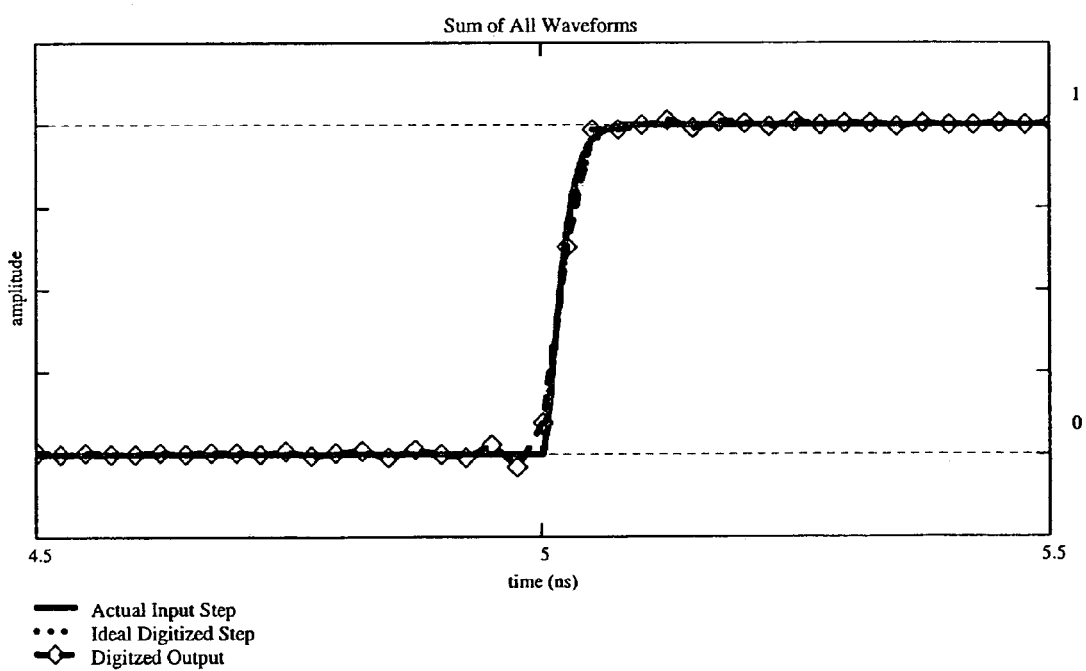

FIGS. 54, 55 and 56 show how successive addition of the processed band outputs causes the resulting waveform to more and more closely approximate the input waveform.

Figure 57:
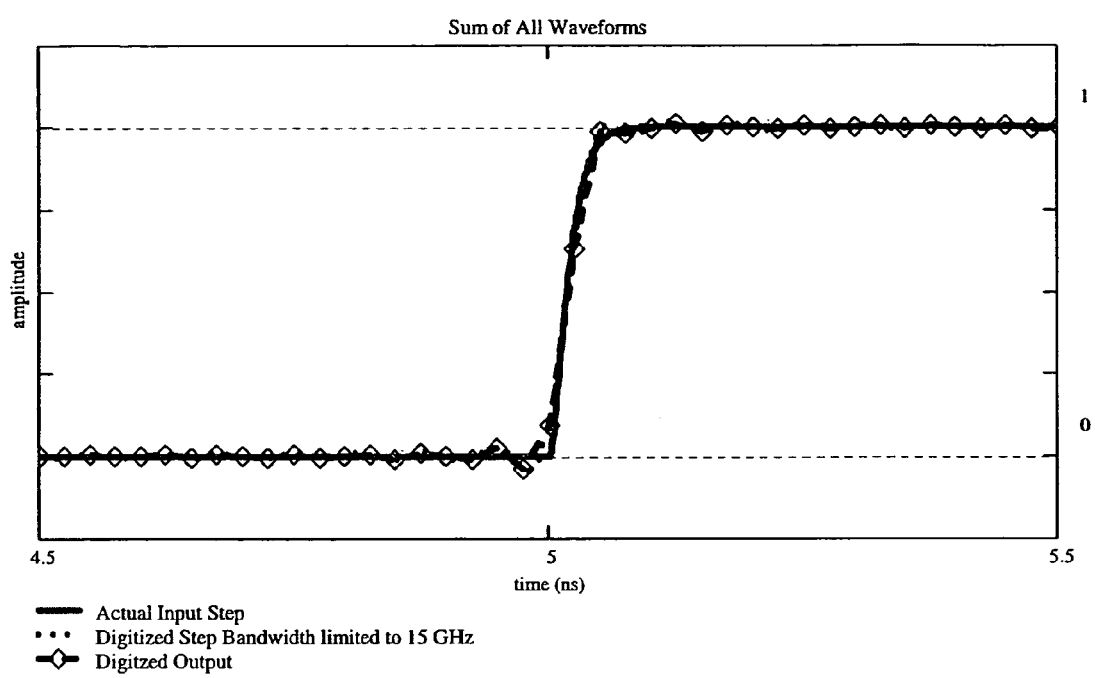

FIG. 57 shows that the result is identical to the input waveform band limited to 15 GHz and shows that the 15 GHz bandwidth limited step is fully recreated.

It should be obvious to one skilled in the art that there are many combinations of translation frequencies and filter choices that will accomplish the objective of this invention. Each has different tradeoffs and implementation considerations depending on the specific application.

It will be understood that the above description of the present invention is susceptible to various modifications, changes and adaptations, and the same are intended to be comprehended within the meaning and range of equivalents of the appended claims. The most obvious modification, for example, is the use of more than two channels.

It will thus be seen that the objects set forth above, among those made apparent from the preceding description, are efficiently attained and, since certain changes may be made in carrying out the above method and in the constructions set forth without departing from the spirit and scope of the invention, it is intended that all matter contained in the above description shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. A method for digitizing a signal, comprising the steps of:
   receiving an input analog signal spanning a frequency range;
   splitting the received input analog signal into a plurality of signals;
   frequency converting at least one of the signals in accordance with a predetermined periodic function having a predetermined frequency;
   digitizing the at least one frequency-converted signal and the remaining unconverted signals; and
   combining the digitized signals mathematically to form a single output stream that is a substantially correct representation of the input analog signal over substantially said frequency range.

2. The method of claim 1, wherein the input analog signal is split by a passive splitter.

3. The method of claim 1, wherein the predetermined periodic function is a sinusoid.

4. The method of claim 1, further comprising the step of, after splitting, band limiting at least one of the signals to a predetermined frequency band range.

5. The method of claim 4, wherein each of the signals is band limited to one of a plurality of predetermined frequency band ranges.

6. The method of claim 4, wherein a frequency of the predetermined periodic function is at a low side of the predetermined frequency band range of the at least one band limited signal.

7. The method of claim 4, wherein a frequency of the periodic function is at a high side of the predetermined frequency band range of the at least one band limited signal.

8. The method of claim 4, wherein at least two of the plurality of predetermined frequency band ranges are substantially contiguous.

9. The method of claim 1, wherein the step of splitting splits the received input analog signal into a plurality of frequency band limited signals.

10. The method of claim 9, wherein at least one of the signals is band limited to one of a plurality of predetermined frequency band ranges.

11. The method of claim 9, wherein a frequency of the predetermined periodic function is at a low side of the band of at least one of the frequency band limited signals.

12. The method of claim 9, wherein a frequency of the periodic function is at a high side of the band of at least one of the frequency band limited signals.

13. The method of claim 9, wherein at least two of the plurality of predetermined frequency band limited signals are positioned within frequency band ranges that are substantially contiguous.

14. The method of claim 1, further comprising the step of passing the frequency converted at least one signal through an image reject filter, having a second predetermined frequency.

15. The method of claim 14, wherein the image reject filter comprises an intrinsic bandwidth of a digitized channel used for digitizing the frequency converted at least one signal.

16. The method of claim 1, wherein the frequency conversion is accomplished by a sampling action of a digitizer used for digitizing the at least one signal.

17. The method of claim 1, wherein the input analog signal is band limited by an amplifier.

18. The method of claim 1, wherein the input analog signal is split by a diplexer.

19. The method of claim 1, wherein the combining further comprises the step of ensuring that the phases of the digitized signals have a fixed relationship.

20. A method for digitizing a signal, comprising the steps of:
   receiving an input analog signal;
   splitting the received input analog date signal into a low frequency band limited signal and a high frequency band limited signal;
   frequency converting at least either the low frequency or the high frequency band limited signal with a predetermined periodic function having a predetermined frequency;
   filtering the frequency converted, band limited signals to a predetermined band range;

digitizing the filtered and the other of the split signals that were not frequency converted;

frequency converting the digitized signals generated from the at least one of the low frequency or high frequency converted, band limited, filtered signals with a predetermined periodic function having the predetermined frequency, resulting in two images of each of the frequency-converted digitized signals; and combining the digitized signals mathematically to form a single output stream that is a substantially correct representation of the input analog signal.

21. The method of claim 20, further comprising the step of equalizing the low frequency and the high frequency signals separately to compensate for non-ideal magnitude and phase characteristics of front-end and digitizing systems for a corresponding channel through which each of the low and high frequency signals passes.

22. The method of claim 20, wherein the input analog signal is split by a passive splitter.

23. The method of claim 20, wherein the predetermined periodic functions are sinusoids.

24. The method of claim 20, wherein the input analog signal is band limited by an amplifier.

25. The method of claim 20, wherein the input analog signal is split by a diplexer.

26. The method of claim 20, further comprising the step of upsampling each digitized signal to a predetermined sample rate.

27. The method of claim 20, further comprising the step of passing the at least one of the high frequency or the low frequency, frequency converted, band limited signals through an image reject filter, having a second predetermined frequency, to remove an unwanted one of the two images from each of the signals.

28. An apparatus for digitizing a signal, comprising:

an input for receiving an input analog signal spanning a frequency range;

a splitter for splitting the received input analog signal into a plurality of signals;

a frequency converter for frequency converting at least one of the signals in accordance with a predetermined periodic function having a predetermined frequency;

a digitizer for digitizing the at least one frequency-converted signal and the remaining unconverted signals; and a combining unit for combining the digitized signals mathematically to form a single output stream that is a substantially correct representation of the input analog signal over substantially said frequency range.

29. The apparatus of claim 28, wherein the splitter is a passive splitter.

30. The apparatus of claim 28, wherein the predetermined periodic function is a sinusoid.

31. The apparatus of claim 28, further comprising a filter for band limiting at least one of the signals to a predetermined frequency band range.

32. The apparatus of claim 31, wherein each of the signals is band limited to one of a plurality of predetermined frequency band ranges.

33. The apparatus of claim 31, wherein at least two of the plurality of predetermined frequency band limited signals are positioned within frequency band ranges that are substantially contiguous.

34. The apparatus of claim 33, wherein the splitter band limits each of the signals to one of a plurality of predetermined frequency band ranges.

35. The apparatus of claim 33, wherein at least two of the plurality of predetermined frequency band ranges are substantially contiguous.

36. The apparatus of claim 33, wherein a frequency of the predetermined periodic function is at a low side of the band of the at least one band limited signal.

37. The apparatus of claim 33, wherein a frequency of the predetermined periodic function is at a high side of the band of the at least one band limited signal.

38. The apparatus of claim 31, wherein a frequency of the predetermined periodic function is at a low side of the band of the at least one band limited signal.

39. The apparatus of claim 31, wherein a frequency of the predetermined periodic function is at a high side of the band of the at least one band limited signal.

40. The apparatus of claim 28, wherein the splitter band limits at least one of the signals to a predetermined frequency band range.

41. The apparatus of claim 28, further comprising an image reject filter having a second predetermined frequency for receiving and passing the frequency converted at least one signal.

42. The apparatus of claim 41, wherein the image reject filter comprises an intrinsic bandwidth of a digitized channel used for digitizing the frequency converted at least one signal.

43. The apparatus of claim 28, wherein the frequency conversion is accomplished by a sampling action of a digitizer used for digitizing said at least one frequency-converted signal.

44. The apparatus of claim 28, wherein the splitter is an amplifier.

45. The apparatus of claim 28, wherein the splitter is a diplexer.

46. The apparatus of claim 28, wherein the combining unit ensures that the phases of the digitized signals are matched.

47. An apparatus for digitizing a signal, comprising:

an input for receiving an input analog signal;

a splitter for splitting the received input analog signal into a low frequency band limited signal and a high frequency band limited signal;

a first heterodyning mixer for frequency converting at least either the high frequency or the low frequency band limited signal with a predetermined periodic function having a predetermined frequency;

a filter for filtering the frequency converted, band limited signals to a predetermined band range;

a digitizer for digitizing the filtered and the other of the band limited signals;

a second heterodyning mixer for frequency converting the digitized signals generated from the at least one of the high frequency or the low frequency, frequency converted, band limited, filtered signals with a predetermined periodic function having the predetermined frequency, resulting in two images of each of the frequency-converted digitized signals; and a combining unit for combining the signals mathematically to form a single output stream that is a substantially correct representation of the input analog signal.

48. The apparatus of claim 47, further comprising an equalizer for equalizing the high frequency and the low frequency signals separately to compensate for non-ideal magnitude and phase characteristics of front-end and digitizing systems for a corresponding channel through which each of the low and high frequency signals passes.

49. The apparatus of claim 47, wherein the splitter is a passive splitter.

50. The apparatus of claim 47, wherein the predetermined periodic functions are sinusoids.

51. The apparatus of claim 47, wherein the splitter is an amplifier.

52. The apparatus of claim 47, wherein the splitter is a diplexer.

53. The apparatus of claim 47, further comprising an upsampler for upsampling each digitized signal to a predetermined sample rate.

54. The apparatus of claim 47, further comprising an image reject filter, having a second predetermined frequency for receiving and passing the at least one of the high frequency or the low frequency, frequency converted, band limited signals to remove an unwanted one of the two images from each of the frequency-converted digitized signals.

55. An apparatus for digitizing a signal, comprising:
an input channel;
a splitter electrically coupled to the input channel;
a plurality of output paths receiving signals from the splitter;
a heterodyning mixer coupled to at least one of the output paths;
a function generator for generating a predetermined periodic function for use by the heterodyning mixer to frequency convert a signal supplied to the heterodyning mixer;
a digitizer coupled to each of the output paths; and
a combining unit coupled to the plurality of output paths;
wherein an output signal is generated that is a substantially correct representation of an input analog signal over substantially the frequency range that is spanned by the input analog signal.

56. The apparatus of claim 55, wherein the combining unit combines the digitized signals from each output path mathematically to form a single output stream that is a substantially correct representation of the input analog signal.

57. A method for digitizing a signal, comprising the steps of:
receiving a plurality of signals;
frequency converting at least one of the signals in accordance with a predetermined periodic function having a predetermined frequency;
digitizing the at least one converted signal and the remaining unconverted signals; and
combining the digitized signals mathematically to form a single output stream that is a substantially correct representation of the plurality of signals over substantially a frequency range spanned by the plurality of signals.

58. An apparatus for digitizing a signal, comprising:
an input for receiving a plurality of signals;
a frequency converter for frequency converting at least one of the plurality of signals in accordance with a predetermined periodic function having a predetermined frequency;
a digitizer for digitizing the at least one frequency-converted signal and the remaining unconverted signals; and
a combining unit for combining the digitized signals mathematically to form a single output stream that is a substantially correct representation of the plurality of input signals over substantially a frequency range spanned by the plurality of input signals.

* * * * *

UNITED STATES PATENT AND TRADEMARK OFFICE
CERTIFICATE OF CORRECTION

PATENT NO. : 7,222,055 B2  Page 1 of 1
APPLICATION NO. : 11/270187
DATED : May 22, 2007
INVENTOR(S) : Peter J. Pupalaikis et al.

It is certified that error appears in the above-identified patent and that said Letters Patent is hereby corrected as shown below:

Col. 16, line 59 (Claim 20)   - delete "date".

Signed and Sealed this

Seventh Day of August, 2007

JON W. DUDAS
*Director of the United States Patent and Trademark Office*

UNITED STATES PATENT AND TRADEMARK OFFICE
CERTIFICATE OF CORRECTION

PATENT NO. : 7,222,055 C1
APPLICATION NO. : 90/011211
DATED : October 3, 2012
INVENTOR(S) : Peter J. Pupalaikis and David C. Graef Page 1 of 1

It is certified that error appears in the above-identified patent and that said Letters Patent is hereby corrected as shown below:

Title Page, Item [73] Assignee, please delete "RBS Citizens, N.A., White Plains, NY (US)" and insert -- LeCroy Corporation, Chestnut Ridge, NY (US) --

Signed and Sealed this
Thirtieth Day of April, 2013

Teresa Stanek Rea
*Acting Director of the United States Patent and Trademark Office*

US007222055C1

(12) EX PARTE REEXAMINATION CERTIFICATE (9328th)
United States Patent
Pupalaikis et al.

(10) Number: US 7,222,055 C1
(45) Certificate Issued: *Oct. 3, 2012

(54) HIGH BANDWIDTH REAL-TIME OSCILLOSCOPE

(75) Inventors: Peter J. Pupalaikis, Ramsey, NJ (US); David C. Graef, Campbell Hall, NY (US)

(73) Assignee: RBS Citizens, N.A., White Plains, NY (US)

Reexamination Request:
   No. 90/012,111, Jan. 27, 2012

Reexamination Certificate for:
   Patent No.: 7,222,055
   Issued: May 22, 2007
   Appl. No.: 11/270,187
   Filed: Nov. 9, 2005

Certificate of Correction issued Aug. 7, 2007.

( * ) Notice: This patent is subject to a terminal disclaimer.

Related U.S. Application Data

(63) Continuation of application No. 10/693,188, filed on Oct. 24, 2003, now Pat. No. 7,058,548.

(60) Provisional application No. 60/420,937, filed on Oct. 24, 2002.

(51) Int. Cl.
   *G01R 23/00* (2006.01)

(52) U.S. Cl. ............ 702/189; 702/75; 702/76; 341/126; 341/155

(58) Field of Classification Search .................. None
   See application file for complete search history.

(56) References Cited

To view the complete listing of prior art documents cited during the proceeding for Reexamination Control Number 90/012,111, please refer to the USPTO's public Patent Application Information Retrieval (PAIR) system under the Display References tab.

*Primary Examiner* — Adam Basehoar

(57) ABSTRACT

A method and apparatus for digitizing a signal. The method comprises the steps of receiving an input analog signal, splitting the received input analog signal into a plurality of signals and frequency converting at least one of the signals in accordance with a predetermined periodic function having a predetermined frequency. The signals are then digitized and combined mathematically to form a single output stream that is a substantially correct representation of the original input analog signal.

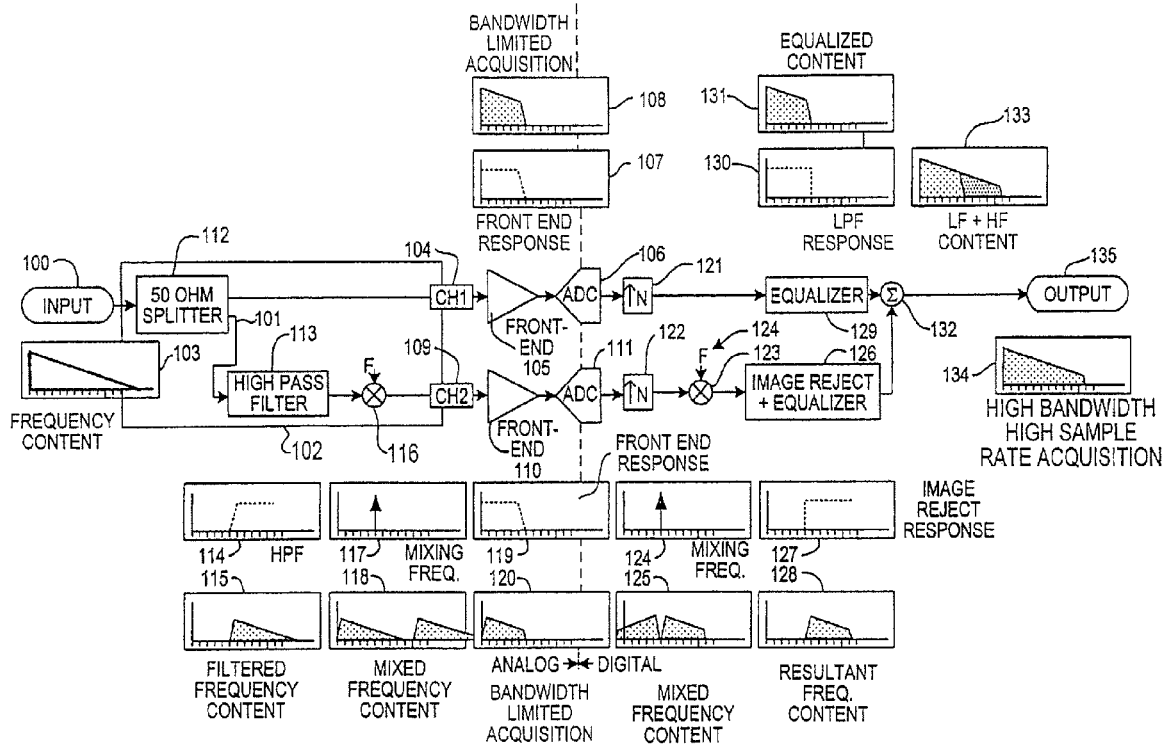

US 7,222,055 C1

EX PARTE
REEXAMINATION CERTIFICATE
ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 20-46 and 58 is confirmed.

Claims 1, 16, 47, 55 and 57 are determined to be patentable as amended.

Claims 2-15, 17-19, 48-54 and 56, dependent on an amended claim, are determined to be patentable.

1. A method for digitizing a signal, comprising the steps of:
receiving an input analog signal spanning a frequency range;
splitting the received input analog signal into a plurality of signals;
frequency converting at least one of the signals in accordance with a predetermined periodic function having a predetermined frequency;
digitizing the at least one frequency-converted signal and the remaining unconverted signals *using multiple respective digitizers*; and
combining the digitized signals mathematically to form a single output stream that is a substantially correct representation of the input analog signal over substantially said frequency range, *wherein the single output data stream has a bandwidth of frequency content that has been digitized by the multiple respective digitizers, and wherein the bandwidth of the frequency content exceeds a bandwidth of each of the multiple respective digitizers*.

16. The method of claim 1, wherein the frequency conversion is accomplished by a sampling action of a [digitizer] *respective one of the multiple respective digitizers* used for digitizing the at least one signal.

47. An apparatus for digitizing a signal, comprising:
an input for receiving an input analog signal;
a splitter for splitting the received input analog signal into a low frequency band limited signal and a high frequency band limited signal;
a first heterodyning mixer for frequency converting at least either the high frequency or the low frequency band limited signal with a predetermined periodic function having a predetermined frequency;
a filter for filtering the frequency converted, band limited signals to a predetermined band range;
a digitizer for digitizing the filtered and the other of the band limited signals, *the digitizer comprising multiple respective single-channel digitizers*;
a second heterodyning mixer for frequency converting the digitized signals generated from the at least one of the high frequency or the low frequency, frequency converted, band limited, filtered signals with a predetermined periodic function having the predetermined frequency, resulting in two images of each of the frequency-converted digitized signals; and
a combining unit for combining the signals mathematically to form a single output stream that is a substantially correct representation of the input analog signal, *wherein the single output data stream has a bandwidth of frequency content that has been digitized by the multiple respective single-channel digitizers, and wherein the bandwidth of the frequency content exceeds a bandwidth of each of the multiple respective single-channel digitizers*.

55. An apparatus for digitizing a signal, comprising:
an input channel;
a splitter electrically coupled to the input channel;
a plurality of output paths receiving signals from the splitter;
a heterodyning mixer coupled to at least one of the output paths;
a function generator for generating a predetermined periodic function for use by the heterodyning mixer to frequency convert a signal supplied to the heterodyning mixer;
a digitizer coupled to each of the output paths, *the digitizer comprising multiple respective single-path digitizers*; and
a combining unit coupled to the plurality of output paths;
wherein, *at an output of the combining unit*, an output signal is generated that is a substantially correct representation of an input analog signal over substantially the frequency range that is spanned by the input analog signal, *wherein the output signal has a bandwidth of frequency content that has been digitized by the multiple respective single-path digitizers, and wherein the bandwidth of the frequency content exceeds a bandwidth of each of the multiple respective single-path digitizers*.

57. A method for digitizing a signal, comprising the steps of:
receiving a plurality of signals;
frequency converting at least one of the signals in accordance with a predetermined periodic function having a predetermined frequency;
digitizing the at least one converted signal and the remaining unconverted signals *using multiple respective digitizers*; and
combining the digitized signals mathematically to form a single output stream that is a substantially correct representation of the plurality of signals over substantially a frequency range spanned by the plurality of signals, *wherein the single output stream has a bandwidth of frequency content that has been digitized by the multiple respective digitizers, and wherein the bandwidth of the frequency content exceeds a bandwidth of each of the multiple respective digitizers*.

* * * * *